United States Patent
Hosseini

(10) Patent No.: US 9,517,929 B2
(45) Date of Patent: Dec. 13, 2016

(54) METHOD OF FABRICATING ELECTROMECHANICAL MICROCHIPS WITH A BURST ULTRAFAST LASER PULSES

(71) Applicant: ROFIN-SINAR TECHNOLOGIES INC., Plymouth, MI (US)

(72) Inventor: S. Abbas Hosseini, Orlando, FL (US)

(73) Assignee: ROFIN-SINAR TECHNOLOGIES INC., Plymouth, MI (US)

( * ) Notice: Subject to any disclaimer, the term of this patent is extended or adjusted under 35 U.S.C. 154(b) by 0 days.

(21) Appl. No.: 14/539,861

(22) Filed: Nov. 12, 2014

(65) Prior Publication Data

US 2015/0140735 A1 May 21, 2015

Related U.S. Application Data

(60) Provisional application No. 61/906,326, filed on Nov. 19, 2013, provisional application No. 61/906,315, filed on Nov. 19, 2013.

(51) Int. Cl.
*B81C 1/00* (2006.01)
*B23K 26/06* (2014.01)
(Continued)

(52) U.S. Cl.
CPC ....... *B81C 1/00238* (2013.01); *B23K 26/0069* (2013.01); *B23K 26/0604* (2013.01); *B23K 26/0624* (2015.10); *B23K 26/0626* (2013.01); *B23K 26/0648* (2013.01); *B23K 26/382* (2015.10); *B23K 26/40* (2013.01); *B81C 1/00634* (2013.01); *C03B 33/0222* (2013.01);
(Continued)

(58) Field of Classification Search
CPC ............... H01L 25/043; H01L 25/0657; H01L 25/0756; H01L 25/117; B23K 26/0069; B23K 26/0604; B23K 26/0624; B23K 26/0626; B23K 26/0648
See application file for complete search history.

(56) References Cited

U.S. PATENT DOCUMENTS 5,107,510 A 4/1992 Seguin et al.
5,567,336 A 10/1996 Tatah
(Continued)

FOREIGN PATENT DOCUMENTS

CA 2332154 9/2009
CA 2907757 9/2014
(Continued)

OTHER PUBLICATIONS

Migliore et al., Advances in Laser Singulation of Silicon, Paper #770, pp. 1-6, Coherent, Inc., Santa Clara, CA, USA; HBL Corporation, Daejeon 305-811 Korea.
(Continued)

*Primary Examiner* — Alonzo Chambliss
(74) *Attorney, Agent, or Firm* — Woodling, Krost and Rust

(57) ABSTRACT

A method for making an electromechanical chip using a plurality of transparent substrates, comprising the steps of: machining, using photoacoustic compression, full or partial voids in at least one of the plurality of substrates. The plurality of transparent substrates are stacked and arranged in a specific order. The transparent substrates are affixed and sealed together. The chip may be sealed by laser welding or adhesive.

11 Claims, 31 Drawing Sheets

(51) Int. Cl.
*B23K 26/00* (2014.01)
*H01L 25/065* (2006.01)
*C03B 33/02* (2006.01)
*B23K 26/40* (2014.01)
*H01L 25/075* (2006.01)
*H01L 25/11* (2006.01)
*H01L 25/04* (2014.01)
*C03B 33/04* (2006.01)

(52) U.S. Cl.
CPC ....... *H01L 25/0657* (2013.01); *B23K 2203/50* (2015.10); *B81C 2201/019* (2013.01); *B81C 2203/036* (2013.01); *B81C 2203/038* (2013.01); *C03B 33/04* (2013.01); *H01L 25/043* (2013.01); *H01L 25/0756* (2013.01); *H01L 25/117* (2013.01)

(56) References Cited

U.S. PATENT DOCUMENTS

| | | | |
|---|---|---|---|
| 5,609,284 | A | 3/1997 | Kondratenko |
| 6,084,897 | A | 7/2000 | Wakabayashi et al. |
| 6,333,485 | B1 | 12/2001 | Haight et al. |
| 6,407,360 | B1 | 6/2002 | Choo et al. |
| 6,417,485 | B1 | 7/2002 | Troitski |
| 6,552,301 | B2 | 4/2003 | Herman et al. |
| 7,033,519 | B2 | 4/2006 | Taylor et al. |
| 7,211,184 | B2 | 5/2007 | Webster et |
| 7,218,448 | B1 | 5/2007 | Cathey, Jr. et al. |
| 7,303,977 | B2 | 12/2007 | Voronov et al. |
| 7,626,138 | B2 | 12/2009 | Bovatsek et al. |
| 8,097,830 | B2 | 1/2012 | Woeste et al. |
| 8,624,157 | B2 | 1/2014 | Albelo et al. |
| 8,835,802 | B2 | 9/2014 | Baer |
| 8,842,358 | B2 | 9/2014 | Bareman et al. |
| 8,852,698 | B2 | 10/2014 | Fukumitsu |
| 9,102,007 | B2 | 8/2015 | Hosseini |
| 9,102,011 | B2 * | 8/2015 | Hosseini ............ B23K 26/0069 |
| 2002/0125232 | A1 | 9/2002 | Choo et al. |
| 2002/0195433 | A1 | 12/2002 | Troitski |
| 2003/0006221 | A1 | 1/2003 | Hong et al. |
| 2003/0072890 | A1 | 4/2003 | Miyazawa |
| 2004/0017428 | A1 | 1/2004 | Cronin et al. |
| 2004/0248503 | A1 | 12/2004 | Benderly |
| 2005/0006361 | A1 | 1/2005 | Kobayashi et al. |
| 2005/0186760 | A1 | 8/2005 | Hashimura et al. |
| 2005/0269301 | A1 | 12/2005 | Burrowes et al. |
| 2006/0099810 | A1 | 5/2006 | Voronov et al. |
| 2006/0108339 | A1 | 5/2006 | Nishiwaki et al. |
| 2006/0207976 | A1 | 9/2006 | Bovatsek et al. |
| 2007/0051706 | A1 | 3/2007 | Bovatsek et al. |
| 2007/0298529 | A1 | 12/2007 | Maeda et al. |
| 2009/0294422 | A1 | 12/2009 | Lubatschowski et al. |
| 2010/0025387 | A1 | 2/2010 | Arai et al. |
| 2010/0084384 | A1 | 4/2010 | Bovatsek et al. |
| 2010/0279067 | A1 | 11/2010 | Sabia et al. |
| 2011/0259631 | A1 | 10/2011 | Rumsby |
| 2012/0234807 | A1 | 9/2012 | Sercel et al. |
| 2012/0235969 | A1 | 9/2012 | Burns et al. |
| 2013/0126573 | A1 | 5/2013 | Hosseini et al. |
| 2013/0183837 | A1 | 7/2013 | Arai et al. |
| 2013/0293482 | A1 | 11/2013 | Burns et al. |
| 2014/0079570 | A1 | 3/2014 | Schweitzer et al. |
| 2014/0199519 | A1 | 7/2014 | Schillinger et al. |
| 2014/0213040 | A1 | 7/2014 | Morikazu et al. |
| 2014/0340730 | A1 | 11/2014 | Bergh et al. |
| 2015/0166393 | A1 | 6/2015 | Marjanovic et al. |
| 2015/0166394 | A1 | 6/2015 | Marjanovic et al. |
| 2015/0360991 | A1 | 12/2015 | Grundmueller et al. |
| 2015/0367442 | A1 | 12/2015 | Bovatsek et al. |
| 2016/0009586 | A1 | 1/2016 | Bookbinder et al. |
| 2016/0031745 | A1 | 2/2016 | Ortner et al. |
| 2016/0059359 | A1 | 3/2016 | Krueger et al. |
| 2016/0060156 | A1 | 3/2016 | Krueger et al. |

FOREIGN PATENT DOCUMENTS

| | | |
|---|---|---|
| CN | 102785031 | 4/2015 |
| EP | 2781296 | 9/2014 |
| EP | 2898982 A2 | 12/2014 |
| EP | 2868421 A1 | 5/2015 |
| EP | 2754524 | 11/2015 |
| JP | 2006305803 | 11/2006 |
| JP | 2009066627 A | 4/2009 |
| JP | 2010160734 | 7/2010 |
| JP | 4692717 | 3/2011 |
| JP | 5089735 | 9/2012 |
| JP | 5271092 | 5/2013 |
| WO | 0125137 A1 | 4/2001 |
| WO | 2009114375 A2 | 9/2009 |
| WO | 2010111089 A2 | 9/2010 |
| WO | 2012006736 | 1/2012 |
| WO | 2012094737 A1 | 7/2012 |
| WO | 2014075995 | 5/2014 |
| WO | 2014079570 | 5/2014 |
| WO | 2014111385 | 7/2014 |
| WO | 2014111794 | 7/2014 |
| WO | 2014121261 | 8/2014 |
| WO | 2014134470 | 9/2014 |
| WO | 2014144322 | 9/2014 |
| WO | 2014147048 | 9/2014 |
| WO | 2014161535 | 10/2014 |
| WO | 2015075059 | 5/2015 |
| WO | 2015094994 | 6/2015 |
| WO | 2015095264 | 6/2015 |
| WO | 2016007843 | 1/2016 |
| WO | 2016010949 | 1/2016 |
| WO | 2016079063 | 5/2016 |
| WO | 2016079275 | 5/2016 |

OTHER PUBLICATIONS

Watanabe et al., Filamentation in Ultrafast Laser Material Processing, Book for Springer Series "Progress in Ultrafast Intense Laser Science", pp. 1-6.
Yoshino et al., Micromachining With a High Repetition Rate Femtosecond Fiber Laser, JLMN-Journal of Laser Micro/Nanoengineering, 2008, pp. 157-162, vol. 3, No. 3.
Rezaei, Saeid, Burst-Train Generation for Femtosecond Laser Filamentation-Driven Micromachining, Thesis, Graduatute Department of Electrical and Computer Engineering, Jan. 2011, pp. 1-118, University of Toronto.
Nguyen et al., Optical Breakdown Versus Filamentation in Fused Silica by Use of Femtosecond Infrared Laser Pulses, Optics Letter, vol. 28, No. 17, Sep. 1, 2003, pp. 1591-1593, Department of Physics, Universite Laval, Quebec, Canada.
Nicholson, David, Laser Pulse Filamentation, Submitted Coursework for PH240, Stanford University, November 27, 2011, pp. 1-4.
Zlotnicki, Steve, What Is Cutting Kerf, May 19, 2013, www.esab-cutting.com, pp. 1-4.
Hosseini, S. Abbas, Method and Apparatus for Non-Ablative, Photoacoustic Compression Machining in Transparent Materials Using Filamentation by Burst Ultrafast Laser Pulses, U.S. Appl. No. 13/958,346, filed Aug. 2, 2013, Applicant: Rofin-Sinar Technologies Inc.
Hosseini, S. Abbas, Method and Apparatus for Performing Laser Filamentation Within Transparent Materials, U.S. Appl. No. 14/336,819, filed Jul. 21, 2014, Applicant: Rofin-Sinar Technologies Inc.
Hosseini, S. Abbas, System for Performing Laser Filamentation Within Transparent Materials, U.S. Appl. No. 14/336,912, filed Jul. 21, 2014, Applicant: Rofin-Sinar Technologies Inc.
Hosseini, S. Abbas, Method of Fabricating A Glass Magnetic Hard Drive Disk Platter Using Filamentation by Burst Ultrafast Laser Pulses, U.S. Appl. No. 14/512,180, filed Oct. 10, 2014, Applicant: Rofin-Sinar Technologies Inc.
Hosseini, S. Abbas, Method and Apparatus for Machining Diamonds and Gemstones Using Filamentation by Burst Ultrafast Laser Pulses, U.S. Appl. No. 14/521,114, filed Oct. 22, 2014, Applicant: Rofin-Sinar Technologies Inc.

(56) References Cited

OTHER PUBLICATIONS

Hosseini, S. Abbas, Method and Apparatus for Hybrid Photoacoustic Compression Machining in Transparent Materials Using Filamentation by Burst Ultrafast Laser Pulses, U.S. Appl. No. 14/520,824, filed Oct. 22, 2014, Applicant: Rofin-Sinar Technologies Inc.
Jha et al., An Integrated PCR Microfluidic Chip Incorporating Aseptic Electrochemical Cell Lysis and Capillary Electrophoresis Amperometric DNA Detection for Rapid and Quantitative Genetic Analysis, The Royal Society of Chemistry, Lab on a Chip, Dec. 2012, 4455-4464.
Applied Biosystems Chemistry Guide, DNA Sequencing by Capillary Electrophoresis, Second Edition, 2009, pp. 1-250.
PE Applied Biosystems, Automated DNA Sequencing, Chemistry Guide, 1998, pp. 1-245.
Hosseini, S. Abbas, Mass Based Filtration Devices and Method of Fabrication Using Bursts of Ultrafast Laser Pulses, U.S. Appl. No. 14/531,761, filed Nov. 3, 2014, Applicant: Rofin-Sinar Technologies Inc.
Muller et al, Short-Pulse Lasers Enable Transparent Materials Processing, Industrial Photonics, Oct. 2014, pp. 8-10.
Hosseini, S. Abbas, Method of Closed Form Release for Brittle Materials Using Burst Ultrafast Laser Pulses, U.S. Appl. No. 14/538,648, filed Nov. 11, 2014, Applicant: Rofin-Sinar Technologies Inc.
European Patent Office, Extended European Search Report, March 18, 2015, pp. 1-6, Application No. 14179302.4, Applicant: Rofin-Sinar Technologies, Inc.
Chin et al., The Propagation of Powerful Femtosecond Laser Pulses in Optical Media: Physics, Applications, and New Challenges, Einstein Centennial Review Article, Can. J. Phys. vol. 83, 2005, pp. 863-905.
Hosseini et al., Measurement of a Filament Length Generated by an Intense Femtosecond Laser Pulse Using Electromagnetic Radiation Detection, Applied Physics B, 2003, pp. 583-586, vol. 76, Quebec, Canada.
Hosseini et al., Multi-Parameter Characterization of the Longitudinal Plasma Profile of a Filament: A Comparative Study, Applied Physics B, 2004, pp. 519-523, vol. 79.
Hosseini et al., Competition of Multiple Filaments During the Propagation of Intense Femtosecond Laser Pulses, The Americal Physical Society, Physical Review A 70, 033802, 2004, pp. 1-12.
Arnold et al., Laser Direct-Write Techniques for Priting of Complex Materials, MRS Bulletin, Jan. 2007, vol. 32 pp. 23-31.
Nagel et al., Laser-Induced Forward Transfer for the Fabrication of Devices, Nanomaterials: Processing and Characterization With Lasers, First Edition, 2012, Published by Wiley-VCH Verlag GMBH & Co. KGAA, pp. 255-316.
Palla-Papavlu et al., Laser Induced Forward Transfer for Materials Patterning, Romanian Reports in Physics, Aug. 2011, vol. 63, Supplement, pp. 1285-1301.
Pique et al., Digital Microfabrication by Laser Decal Transfer, JLMN—Journal of Laser Micro/Nanoengineering, 2008, vol. 3, No. 3, pp. 163-169.
European Patent Office, European Search Report, May 18, 2015, pp. 1-6, Application No. 14193909.0, Applicant: Rofin-Sinar Technologies, Inc.
Gill, Jonathan, Creating an Exotic New Form of Light With Simple Optical Elements, Nov. 2014, pp. 1-21, Waldorf School of Garden City, Garden City, New York, Laser Teaching Center Department of Physics and Astronomy, Stony Brook University, Intel Science Talent Search.
Dowski et al, Extended Depth of Field Through Wave-Front Coding, Applied Optics, Apr. 10, 1995, vol. 34, No. 11, pp. 1859-1866.
Arnison et al., High Resolution Extended Depth of Field Microscopy Using Wavefront Coding, pp. 1-19.
Siviloglou, Georgios A., Accelerating Optical Airy Beams, Dissertation, 2010, pp. 1-166.
Hosseini, S. Abbas, Method and Apparatus for Forward Deposition of Material Onto a Substrate Using Burst Ultrafast Laser Pulse Energy, U.S. Appl. No. 14/542,647, filed Nov. 16, 2014, Applicant: Rofin-Sinar Technologies, Inc.
Hosseini, S. Abbas, Method and Apparatus for Spiral Cutting a Glass Tube Using Filamentation by Burst Ultrafast Laser Pulses, U.S. Appl. No. 14/547,729, filed Nov. 19, 2014, Applicant: Rofin-Sinar Technologies Inc.
Hosseini, S. Abbas, Method and Apparatus for Laser Processing of Silicon by Filamentation of Burst Ultrafast Laser Pulses, U.S. Appl. No. 14/556,078, filed Nov. 28, 2014, Applicant: Rofin-Sinar Technologies, Inc.
Hosseini, S. Abbas, Method and Apparatus for Material Processing Using Multiple Filamentation of Burst Ultrafast Laser Pulses, U.S. Appl. No. 14/629,327, filed Feb. 23, 2015, Applicant: Rofin-Sinar Technologies, Inc.
Hosseini, S. Abbas, Method and System for Scribing Heat Processed Transparent Materials, U.S. Appl. No. 14/700,228, filed Apr. 30, 2015, Applicant: Rofin-Sinar Technologies, Inc.
Hosseini, S. Abbas, Method and Apparatus for Performing Laser Curved Filamentation Within Transparent Materials, U.S. Appl. No. 14/742,187, filed Jun. 17, 2015, Applicant: Rofin-Sinar Technologies, Inc.
European Patent Office, Extended European Search Report, Jul. 29, 2015, pp. 1-8, Application No. 14193908.2, Applicant: Rofin-Sinar Technologies, Inc.
European Patent Office, Extended European Search Report, Jul. 14, 2015, pp. 1-14, Application No. 14195892.6, Applicant: Rofin-Sinar Technologies, Inc.
European Patent Office, Extended European Search Report, Feb. 26, 2015, pp. 1-7. Application No. 14193911.6, Applicant: Rofin-Sinar Technologies, Inc.
European Patent Office, Extended European Search Report, Mar. 11, 2015, pp. 1-6, Application No. 14191146.1, Applicant: Rofin-Sinar Technologies, Inc.
European Patent Office, Partial European Search Report, May 18, 2015, pp. 1-6, Application No. 14193909, Applicant: Rofin-Sinar Technologies, Inc.
European Patent Office, Extended European Search Report, Sep. 14, 2015, pp. 1-7, Application No. 14179403.2, Applicant: Rofin-Sinar Technologies, Inc.
European Patent Office, Extended European Search Report, Sep. 24, 2015, pp. 1-13, Application No. 14193909, Applicant: Rofin-Sinar Technologies, Inc.
Applied Biosystems Chemistry Guide, DNA Sequencing by Capillary Electrophoresis, Second Edition, 2009, pp. 1-310.

\* cited by examiner

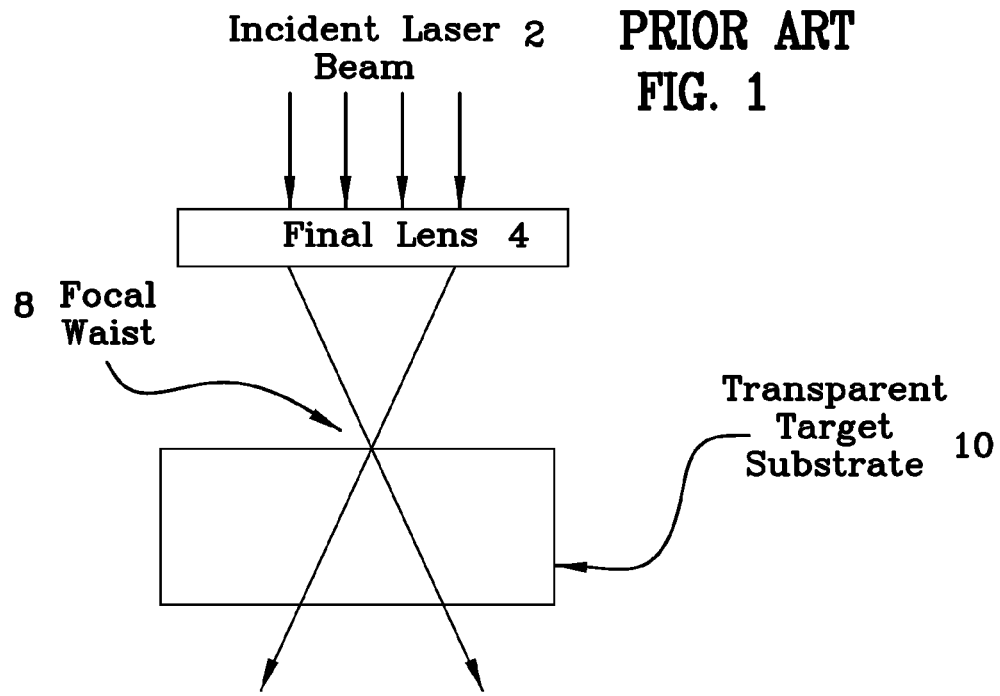
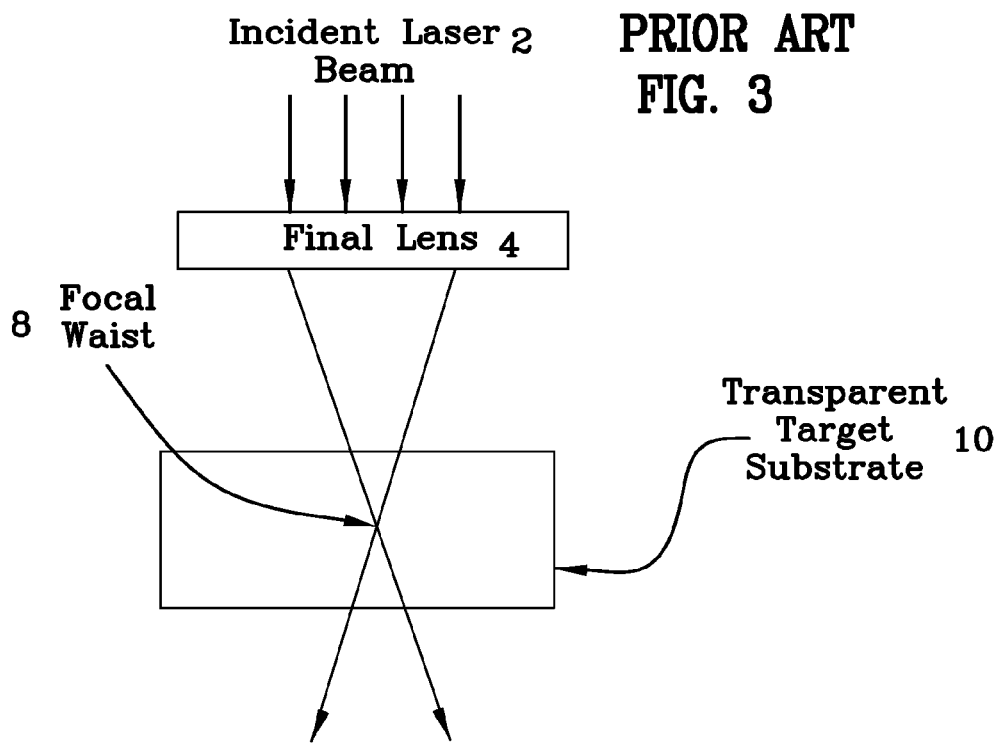

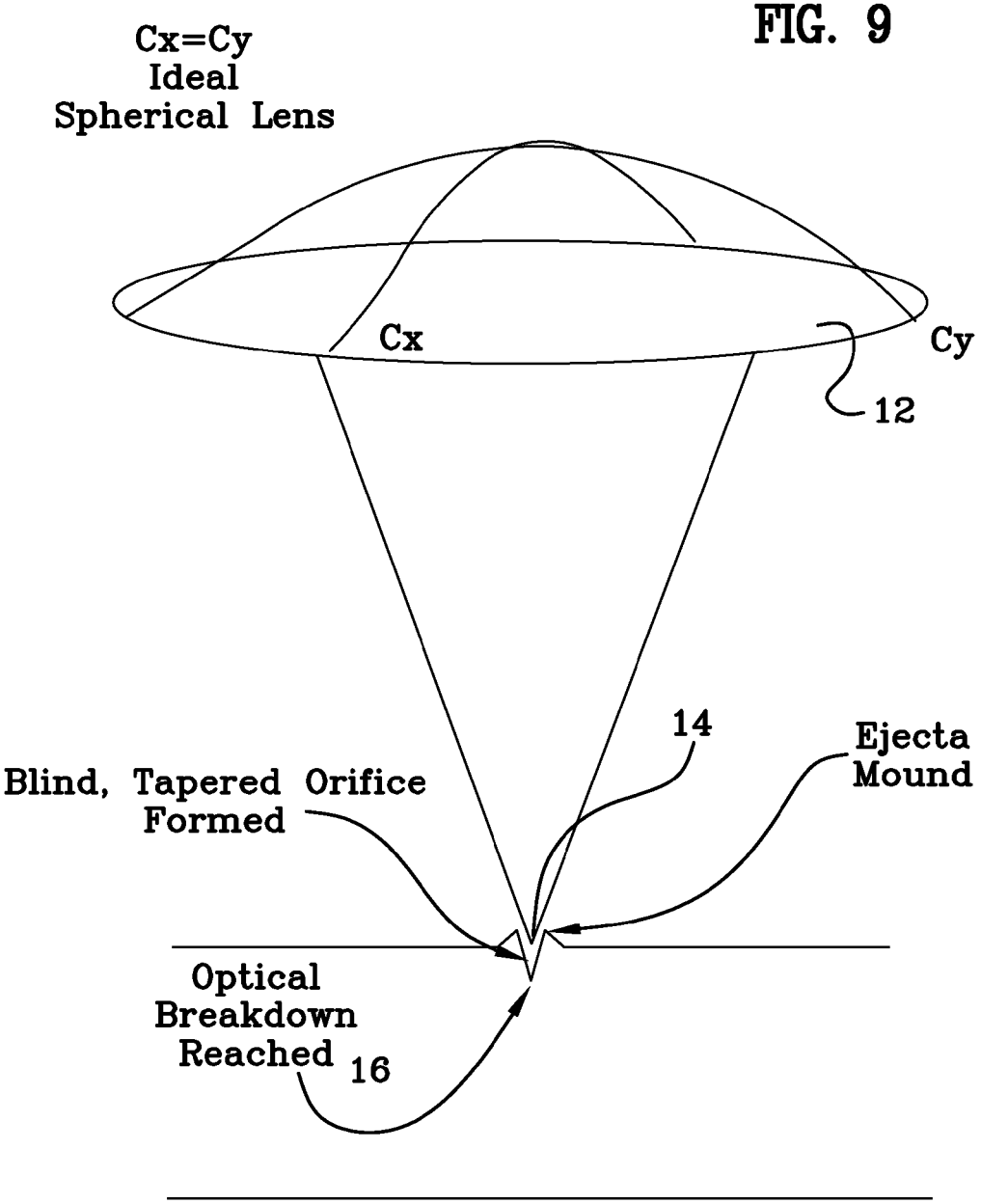

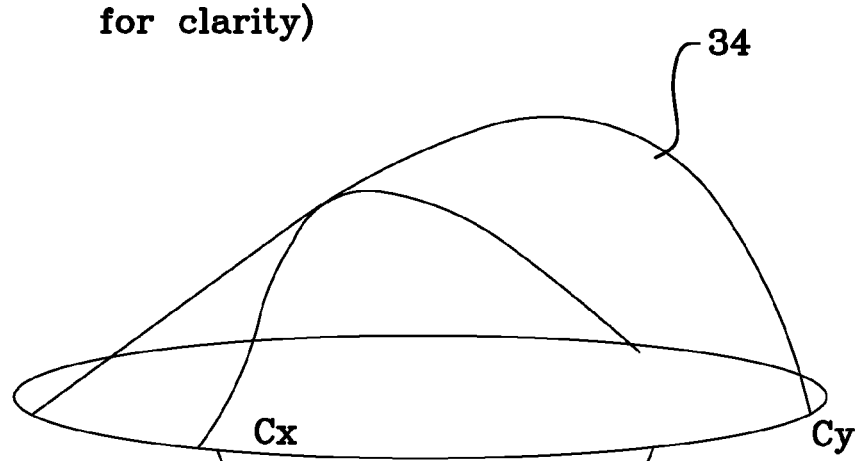
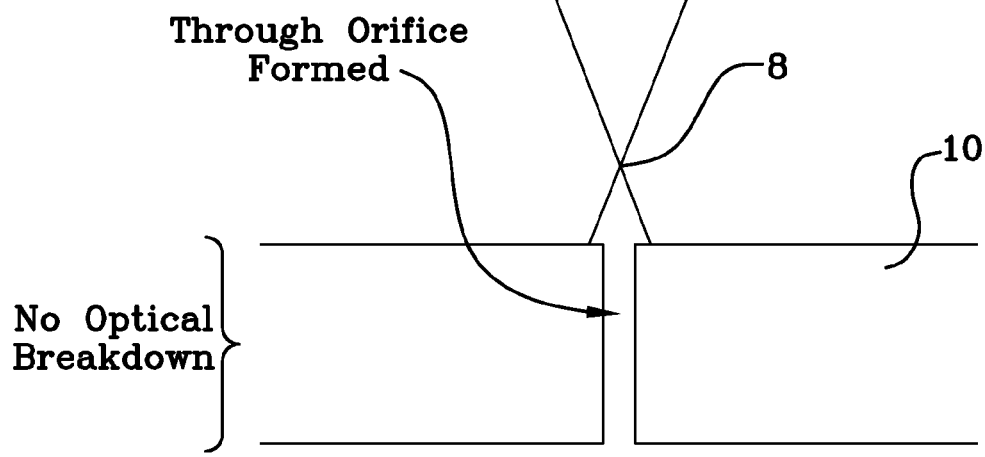
FIG. 10

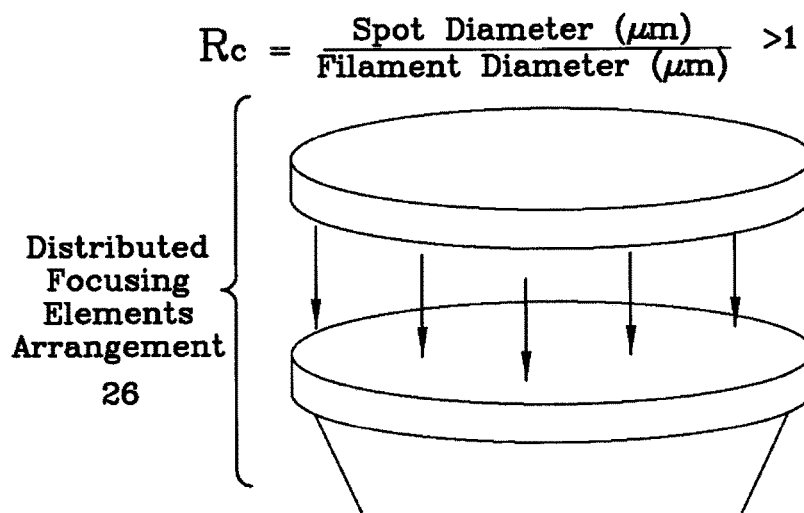
$$R_c = \frac{\text{Spot Diameter } (\mu m)}{\text{Filament Diameter } (\mu m)} > 1$$
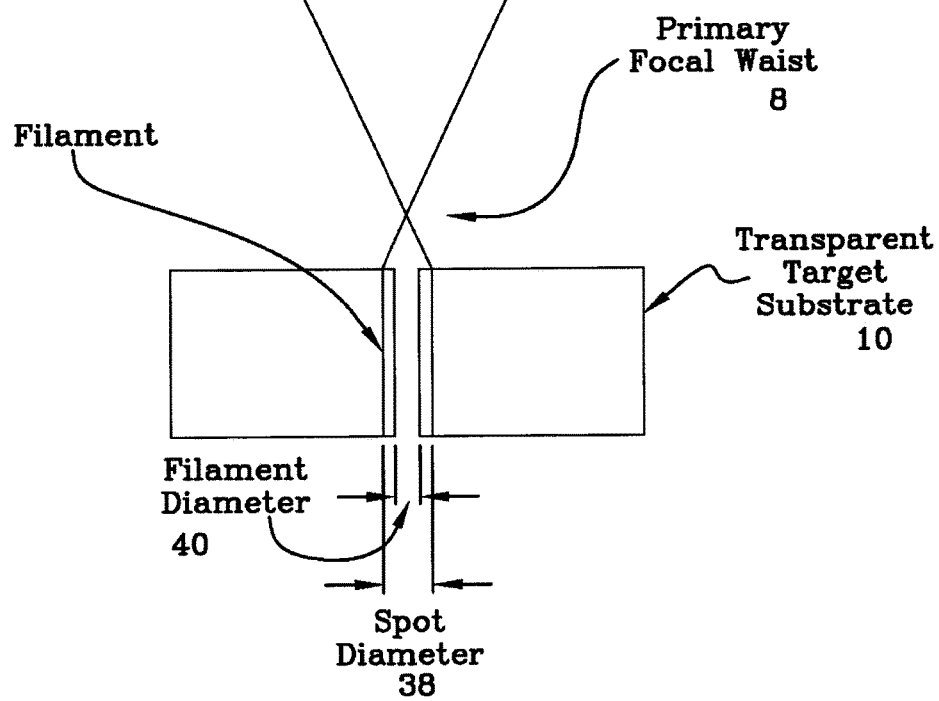
FIG. 11

METHOD OF FABRICATING ELECTROMECHANICAL MICROCHIPS WITH A BURST ULTRAFAST LASER PULSES

This patent application claims priority to and the benefit of U.S. provisional patent application Ser. No. 61/906,326 filed Nov. 19, 2013. U.S. provisional patent application Ser. No. 61/906,326 filed Nov. 19, 2013 is incorporated herein in its entirety by reference hereto.

This patent application claims priority to and the benefit of U.S. provisional patent application Ser. No. 61/906,315 filed Nov. 19, 2013. U.S. provisional patent application Ser. No. 61/906,315 filed Nov. 19, 2013 is incorporated herein in its entirety by reference hereto.

BACKGROUND OF THE INVENTION

The present invention relates to a greatly miniaturized electro/mechanical microchip that is low cost. The microchips made by the invention are suitable for a one time use. The material selection is from a transparent material such as glass, Si, $LiTiO_3$, $LiNbO_3$, transparent ceramics, polymers, transparent conductors, wide bandgap glasses, crystals, crystalline quartz, diamonds (natural or man-made), sapphire, rare earth formulations, metal oxides for displays and amorphous oxides in polished or unpolished condition with or without coatings. They are made using a method and apparatus for machining transparent target substrates involving filamentation by burst ultrafast laser pulses.

There is a huge demand for the continued miniaturization of electro/mechanical microchips such as biochips, and MEMs devices. Microelectromechanical systems (MEMS) is the technology of very small devices. Traditional photolithographic processes may be used to form electronic devices in substrates and include the application of photoresist, masks, applying light to imidize portions of the photoresist, wet and dry etching, etc. The method for making a MOSFET includes application of photoresist, masking, and etching. See, for example, U.S. Pat. No. 7,389,675 to Hunter et al. issued Jun. 24, 2008.

Creation of microfluidic channels generally uses molding and the sample is covered with a glass plate and glued. Others have attempted without success to manufacture microchannels in bulk glass using laser alteration and etching.

Not only does it reduce the cost of the materials, it allows for more system complexity in less space. Microfabrication is directed primarily to mechanical drilling or scribing methods and/or laser micromachining, laser modification, chemical etching, masking and plating and molding techniques. Thicker substrates are necessary for the underlying structure, and while these methods are constantly being refined, the next level of miniaturization will require much more precision.

Henceforth, an electro/mechanical microchip that can be constructed on a thinner substrate with smaller functional elements such as electrical pathways, component securement points, fluid/gas pathways, size separators/filters and the like would fulfill a long felt need in the electro/mechanical microchip industry. This new invention utilizes and combines new technologies in a unique and novel configuration to overcome the aforementioned problems and accomplish this.

SUMMARY OF THE INVENTION

The general purpose of the present invention, which will be described subsequently in greater detail, is to provide a miniaturized electro/mechanical microchip that utilizes new techniques and materials that greatly simplify its fabrication and cost, down to the level of disposable, single use microchips. The chip can be used in a hand held device or machine as a sample holder and analyzer and further processing can be done in the main module. The chip can be thrown away after each use. Or it can be designed to work in hazardous regions as a wireless detector or analyzer.

Drilling completely through a substrate or drilling stopped orifices in a substrate is performed by the process of the invention. Additionally, machining channels in glass (or other transparent material) is performed by the process of the invention. A material machining technique involving filamentation by bursts of ultrafast laser pulses with specific adjustments of the laser parameters in conjunction with a distributed focus lens assembly that creates a plurality of different foci wherein the principal focal waist never resides in or on the surface of the transparent substrate target, so as to create a filament in the transparent substrate target material that develops an orifice in any or each member of a stacked array of the transparent substrate target material wherein the orifice has a specified depth and width at a desired point of initiation and point of termination within the desired wafer, plate or substrate. While the present disclosure focuses primarily on the drilling of orifices, the systems and methods described herein are equally applicable to the machining processes of drilling, dicing, cutting, channel formation, reservoir formation and scribing targets by the continued movement of the laser beam responsible for the orifice drilling filament formed within the substrate. Such machining may be in nonlinear configurations, and as such the machining is not restricted to planar substrates.

The method for machining disclosed herein produces less waste and allows for more intricate cuts than can be accomplished by the prior art. More particularly, it allows for machining pathways and component mounting and operational voids in any substrate layer of a multi layer electro/mechanical microchip using a novel method using interference of a burst or bursts of ultrafast laser pulses wherein the laser light and focusing parameters have been adjusted to create a filament inside the material that can create an orifice of specified depth and width at the desired point of initiation and at the desired point of termination.

A novel and unique technique to create nanometer to micrometer scale sized orifices and width cuts in and through transparent material such as borosilicate glass, Si wafers, glass or Sapphire is disclosed. It has many of the advantages mentioned heretofore and many novel features that result in a new method of making cheap miniaturized electro/mechanical microchips which is not anticipated, rendered obvious, suggested, or even implied by any of the prior art, either alone or in any combination thereof Specifically, it offers considerable advances over the prior art in that these devices can be made much more precisely, cheaply, thinner and smaller. The machining offers smoother cut surfaces, minimal micro-crack propagation, longer/deeper orifice creation, non-tapered orifices, nonlinear absorption, orifices with a consistent internal diameter, minimized entrance distortion and reduced collateral damage.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements. Other objects, features and aspects of the present invention are discussed in greater detail below.

BRIEF DESCRIPTION OF THE DRAWINGS

FIG. 1 is a diagrammatic representation of a prior art ablative laser machining arrangement wherein the principal focus occurs at the top surface of the transparent substrate;

FIG. 3 is a representative side view of a prior art ablative laser machining arrangement wherein the principal focus occurs below the top surface of the transparent substrate;

FIG. 9 is a diagrammatic representation of the prior art ablative laser drilling arrangement;

FIG. 10 is a diagrammatic representation of the present invention;

FIG. 11 is a diagrammatic view of the present invention utilizing a distributed focus lens arrangement;

DETAILED DESCRIPTION

Figure 2:
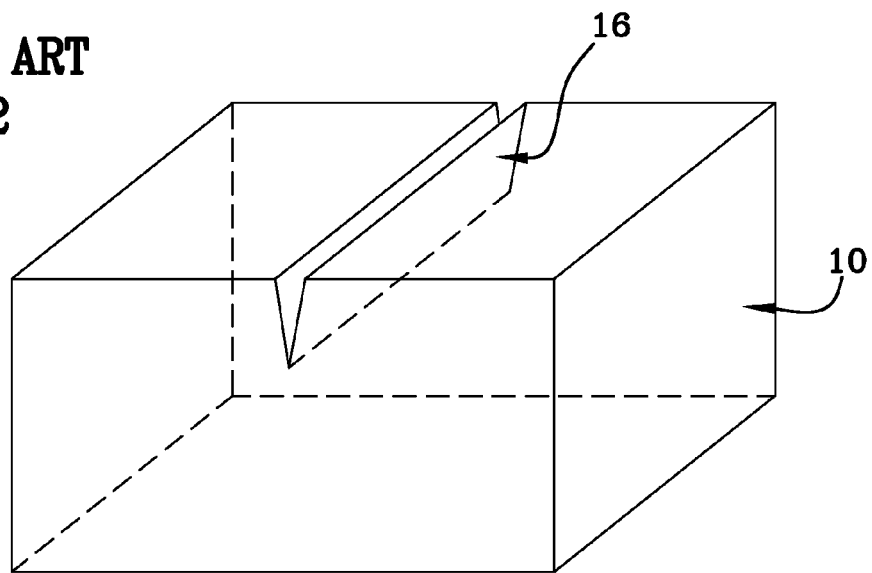
FIG. 2 is a perspective view of an orifice formed by the machining arrangement of FIG. 1.

There has thus been outlined, rather broadly, the more important features of the invention in order that the detailed description thereof that follows may be better understood and in order that the present contribution to the art may be better appreciated. There are, of course, additional features of the invention that will be described hereinafter and which will form the subject matter of the claims appended hereto.

Various embodiments and aspects of the disclosure will be described with reference to details discussed below. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosure.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of descriptions and should not be regarded as limiting.

The main objective of the present invention is to provide a method for the fast, precise, and economical non-ablative laser machining to cut shapes, scribe or drill holes in transparent substrates by filamentation by a burst(s) of ultrafast laser pulses. The actual creation of the thin wafers from a larger target, is also part of the process. The apparatus and methodology employed to machine the microchips will be detailed herein as the laser machining technology and the laser machining system.

The Laser Machining Technology

Stopped or through orifices may be drilled beginning at any depth, or in any one of a set of stacked wafers, plates or substrates, primarily, but not limited to, transparent materials such that the structural characteristics of the orifice and surrounding material exceed that found in the prior art.

Movement of the laser beam in relation to the target substrate offers machining in the form of substrate (target) slicing or cutting. This can be accomplished in any or each member of a stacked array of materials by a novel method using filamentation of burst of ultrafast laser pulses wherein the laser light and focusing parameters have been adjusted to create a filament inside the material that can create an orifice or cut through a specified depth of the transparent substrate.

Unless defined otherwise, all technical and scientific terms used herein are intended to have the same meaning as commonly understood to one of ordinary skill in the art. Unless otherwise indicated, such as through context, as used herein, the following terms are intended to have the following meanings:

As used herein, the term ablative drilling refers to a method of machining a target (generally by cutting or drilling of a substrate by the removal of material) surface by irradiating it with a laser beam. At low laser flux, the material is heated by the absorbed laser energy and evaporates or sublimates. At high laser flux, the material is typically converted to plasma. Usually, laser ablation refers to removing material with a pulsed laser, but it is possible to ablate material with a continuous wave laser beam if the laser intensity is high enough. Ablative drilling or cutting techniques are characterized by the creation of a debris field, the presence of a liquid/molten phase at some point during the material removal process, and the creation of an ejecta mound at the entrance and or exit of the feature.

As used herein, the term "photoacoustic cutting" refers to a method of machining a target generally by cutting or drilling of a substrate from a solid by irradiating it with a lower pulse energy light beam than is used in ablative drilling or cutting techniques. Through the processes of optical absorption followed by thermoelastic expansion, broadband acoustic waves are generated within the irradiated material to form a pathway of compressed material about the beam propagation axis (common with the axis of the orifice) therein that is characterized by a smooth wall orifice, a minimized or eliminated ejecta and minimized microcrack formation in the material. This phenomena is also known as "photoacoustic compression".

As used herein the term "optical efficiency" relates to the ratio of the fluence at the principal focal waist to the total incident fluence at the clear aperture of the focusing element or assembly.

As used herein, the term "transparent" means a material that is at least partially transparent to an incident optical beam. More preferably, a transparent substrate is characterized by absorption depth that is sufficiently large to support the generation of an internal filament modified array by an incident beam according to embodiments described herein. A transparent material has an absorption spectrum and thickness such that at least a portion of the incident beam is transmitted in the linear absorption regime.

As used herein, the term "filament modified zone" refers to a filament region within a substrate characterized by a region of compression defined by the optical beam path.

As used herein, the phrases "burst", "burst mode", or "burst pulses" refer to a collection of laser pulses having a relative temporal spacing that is substantially smaller than the repetition period of the laser. It is to be understood that the temporal spacing between pulses within a burst may be constant or variable and that the amplitude of pulses within a burst may be variable, for example, for the purpose of creating optimized or pre-determined filament modified zones within the target material. In some embodiments, a burst of pulses may be formed with variations in the intensities or energies of the pulses making up the burst.

As used herein, the phrase "geometric focus" refers to the normal optical path along which light travels based on the curvature of the lens, with a beam waist located according to the simple lens equation common to optics. It is used to distinguish between the optical focus created by the position of the lenses and their relation to one another and the constriction events created by thermal distortion in the target materials providing, in effect, a quasi-Rayleigh length on the order of up to 15 mm, which is particularly uncommon and related to the inventive nature of this work.

As used herein, the term "substrate" means a transparent material target and may be selected from the group consisting of transparent ceramics, polymers, transparent conductors, wide bandgap glasses, crystals, crystalline quartz, diamonds (natural or man-made), sapphire, rare earth formulations, metal oxides for displays and amorphous oxides in polished or unpolished condition with or without coatings, and meant to cover any of the geometric configurations thereof such as but not limited to plates and wafers. The substrate may comprise two or more layers wherein a location of a beam focus of the focused laser beam is selected to generate filament arrays within at least one of the two or more layers. The multilayer substrate may comprise multi-layer flat panel display glass, such as a liquid crystal display (LCD), flat panel display (FPD), and organic light emitting display (OLED). The substrate may also be selected from the group consisting of autoglass, tubing, windows, biochips, optical sensors, planar lightwave circuits, optical fibers, drinking glass ware, art glass, silicon, 111-V semiconductors, microelectronic chips, memory chips, sensor chips, electro-optical lenses, flat displays, handheld computing devices requiring strong cover materials, light emitting diodes (LED), laser diodes (LD), and vertical cavity surface emitting laser (VCSEL). Targets or target materials are generally selected from substrates.

As used herein the "principal focal waist" refers to the most tightly focused and strongest focal intensity of the beam after final focusing (after passing through the final optical element assembly prior to light incidence upon the target). It may also be used interchangeably with the term "principal focus." The term "secondary focal waist" refers to any of the other foci in the distributed beam having a lesser intensity than the principal focal waist. It may also be used interchangeably with the term "secondary focus' or "secondary foci."

As used herein the term "filament" refers to any light beam traveling through a medium wherein the Kerr effect can be observed or measured.

As used herein, "laser filamentation" is the act of creating filaments in a material through the use of a laser.

As used herein the term "sacrificial layer" refers to a material that can be removeably applied to the target material.

As used herein the term "machining" or "modification" encompasses the processes of drilling orifices, cutting, scribing or dicing a surface or volume of a target or substrate.

As used herein the term "focal distribution" refers to spatiotemporal distribution of incident light rays passing through a lens assembly that, in its aggregate, is a positive lens. Generally, herein their subsequent convergence of spots of useful intensity as a function from the distance from the center of the focusing lens is discussed.

As used herein the terms "critical energy level," "threshold energy level" and 'minimum energy level" all refer to the least amount of energy that must be put into or onto a target to initiate the occurrence of a transient process in the target material such as but not limited to ablative machining, photoacoustic machining, and the Kerr effect.

As used herein the term "aberrative lens" refers to a focusing lens that is not a perfect lens wherein the lens curvature in the X plane does not equal the lens curvature in the Y plane so as to create a distributed focal pattern with incident light that passes through the lens. A positive aberrative lens is a focally converging lens and a negative abberrative lens is a focally diverging lens.

As used herein, the terms, "comprises" and "comprising" are to be construed as being inclusive and open ended, and not exclusive. Specifically, when used in the specification and claims, the terms, "comprises" and "comprising" and variations thereof mean the specified features, steps or components are included. These terms are not to be interpreted to exclude the presence of other features, steps or components.

As used herein, the term "exemplary" means "serving as an example, instance, or illustration," and should not be construed as preferred or advantageous over other configurations disclosed herein.

As used herein, the terms "about" and "approximately" are meant to cover variations that may exist in the upper and lower limits of the ranges of values, such as variations in properties, parameters, and dimensions.

The following methodology will provide fast, reliable and economical non-ablative laser machining technique to initiate orifices (stopped/blind or through orifices) in the target material that may be initiated below or above a single or multiple stacked target material (or on either side of a tube) by filamentation by a burst(s) of ultrafast laser pulses. The movement of the laser beam with respect to the target material will direct the filament to cut or slice the target.

Ultra short lasers offer high intensity to micromachine, to modify and to process surfaces cleanly by aggressively driving multi-photon, tunnel ionization, and electron-avalanche processes. The issue at hand is how to put enough energy in the transparent material of the target, less than that used in ablative drilling, but beyond the critical energy level to initiate and maintain photoacoustic compression so as to create a filament that modifies the index of refraction at the focal points in the material and does not encounter optical breakdown (as encountered by the prior art ablative drilling systems) such that continued refocusing of the laser beam in the target material can continue over long distances, enough so that even multiple stacked substrates can be drilled simultaneously with negligible taper over the drilled distance, a relatively smooth orifice wall and can initiate from above, below or within the target material. The filament formed by the fabrication unit's direction/steering can be used to drill orifices, cut, scribe or dice a surface or volume of a target.

Generally, in the prior art, laser ablation techniques that utilize a high energy pulsed laser beam that is focused to a single principal focus above, within or at a surface of the material, have been used to machine transparent materials. The main issue of the prior art is a slow speed process, facets with microcracks, and wide kerf width with debris on the surface. Additionally, the prior art processes result in cut walls which always have an angle and the cuts cannot be done sharply in the vertical direction.

Figure 4:
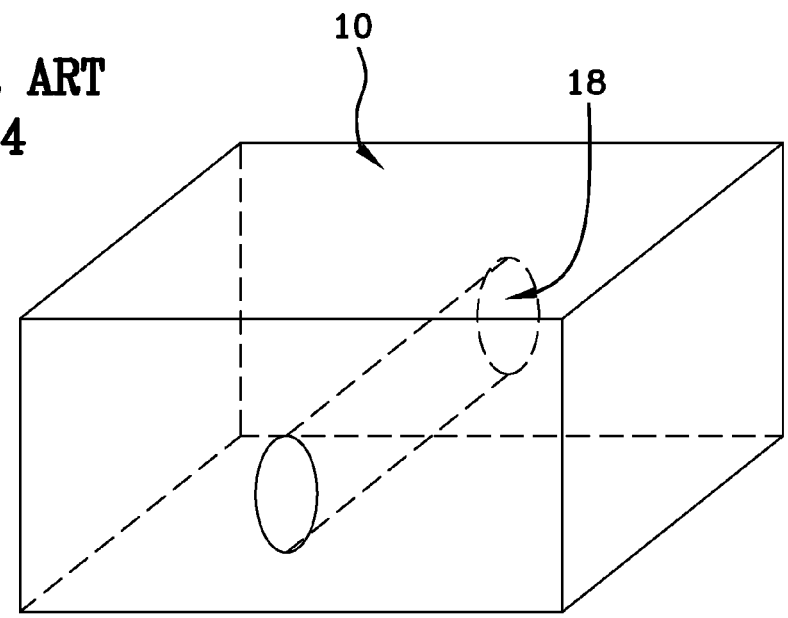
FIG. 4 is a perspective view of an orifice formed by the laser machining arrangement of FIG. 3.

As shown in FIG. 1 the incident laser light beam 2 passes through a focusing assembly passing through a final focusing lens 4 so as to focus a non-distributed light beam 6 that has a focal waist 8 at the surface of the target 10. As can be seen in FIG. 3, optionally, the non-distributed light beam may be focused such that the focal waist resides within the target. Generally these techniques use a perfect spherical focusing lens 12, that is to say a lens that is non-aberrated that has curvature in the X plane that equals the curvature in the Y plane (Cx=Cy) or alternatively with a focusing element assembly that produces a non-distributed beam having a single focus 14 as shown in FIG. 9. This creates a tight beam spot that is then delivered on (FIG. 1) or in the target substrate material 10. See FIG. 3. FIG. 2 illustrates the geometry of a machined slot 16 cut with the technique of FIG. 1, and FIG. 4 illustrates the geometry of an oblong orifice 18 made with the technique of FIG. 3.

Propagation of intense ultrafast laser pulses in different optical media has been well studied. Nonlinear refractive index of a material is a function of laser intensity. Having an intense laser pulse with Gaussian profile, wherein the central part of the pulse has much higher intensity than the tails, means the refractive index varies for the central and surrounding areas of the material seeing the laser beam pulse. As a result, during propagation of such laser pulse, the pulse collapses automatically. This nonlinear phenomenon is known in science as self-focusing. Self-focusing can be promoted also using a lens in the beam path. In the focal region the laser beam intensity reaches a value that is sufficient to cause multiple-ionization, tunnel ionization and avalanche ionization, which creates plasma in the material. Plasma causes the laser beam to defocus and due to high peak intensity pulse refocus back to form the next plasma volume. The inherent problem with a single focus in a non-distributed beam is that the process ends after the laser pulses lose all their energy and are unable to refocus as discussed below.

This ablative method develops a filament in the material 10 of a length of up to 30 microns until it exceeds the optical breakdown threshold for that material and optical breakdown (OB) 16 occurs. See FIG. 9. At OB the maximum threshold fluence (the energy delivered per unit area, in units of $J/m^2$) is reached and the orifice diameter narrows and ablative machining or drilling ceases to proceed any deeper. This is the obvious drawback to using the prior art methods as they limit the size of the orifice that can be drilled, cause a rough orifice wall and result in an orifice with a taper 22 having a different diameter at the top and bottom surfaces of the target 10. See FIG. 5. This occurs because in ablative machining, the beam has central focus 8 (also referred to as a principal focal waist) at the surface of the target 10 causing localized heating and thermal expansion therein heating the surface of the material 10 to its boiling point and generating a keyhole. The keyhole leads to a sudden increase in optical absorptivity quickly deepening the orifice. As the orifice deepens and the material boils, vapor generated erodes the molten walls blowing ejecta 20 out and further enlarging the orifice 22. As this occurs, the ablated material applies a pulse of high pressure to the surface underneath it as it expands. The effect is similar to hitting the surface with a hammer and brittle materials are easily cracked. Additionally, brittle materials are particularly sensitive to thermal fracture which is a feature exploited in thermal stress cracking but not desired in orifice drilling. OB generally is reached when the debris is not ejected, a bubble is created in the orifice 22 or there is a violent ablation that cracks the target in the area of the orifice 22. Any one or combination of these effects causes the beam 6 to scatter from this point or be fully absorbed not leaving enough beam power (fluence) to drill down through the material 10 any further. Additionally, this creates a distortion or roughness known as the ablative ejecta mound 20 found around the initiating point at the surface of the target substrate 10. See FIG. 5.

Figure 5:
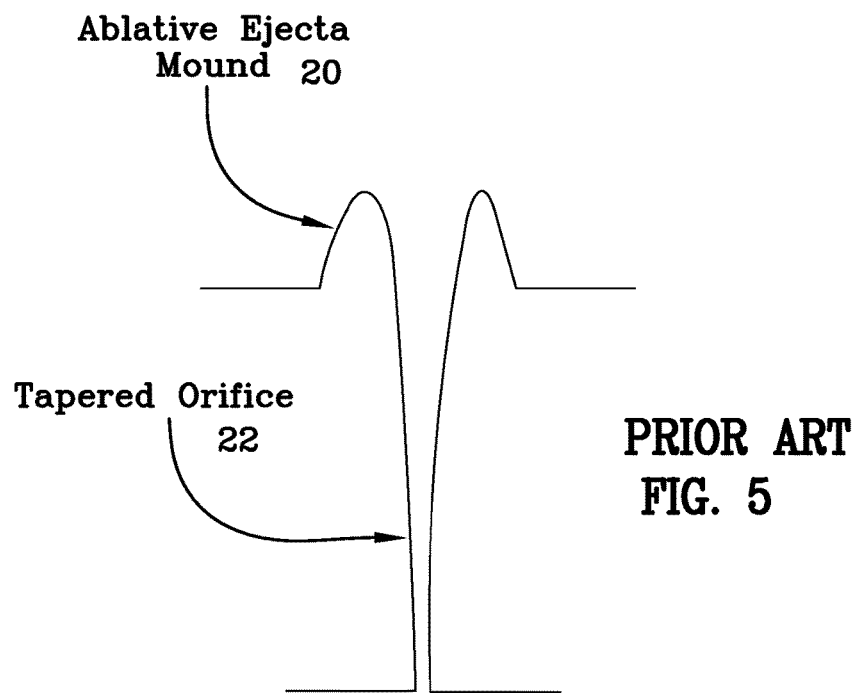
FIG. 5 is a representative side view of an orifice ablatively machined as the laser arrangement of FIG. 1 wherein the primary focus occurs at the top surface of the transparent substrate.

Another problem with laser ablation techniques is that the orifices it drills are not of a uniform diameter as the laser beam filamentation changes its diameter as a function of distance. This is described as the Rayleigh range and is the distance along the propagation direction of a beam from the focal waist to the place where the area of the cross section is doubled. This results in a tapered orifice 22 as shown in FIGS. 2 and 5. The present invention solves the optical breakdown problem, minimizes the orifice roughness and the ablative ejecta mound, and eliminates the tapering diameter orifice.

The present disclosure provides devices, systems and methods for the processing of orifices in transparent materials by laser induced photoacoustic compression. Unlike previously known methods of laser material machining, embodiments of the present invention utilize an optical configuration that focuses the incident beam 2 in a distributed manner along the longitudinal beam axis such that there is a linear alignment of the principal focus 8 and secondary foci 24 (coincident to the linear axis of the orifice but vertically displaced from the principal focus or focal waist) to allow the continual refocusing of the incident beam 2 as it travels through the material 10 thereby enabling the creation of a filament that modifies the index of refraction along the beam path in the material 10 and does not encounter optical breakdown (as seen in the prior art ablative drilling systems both with and without the use of rudimentary filamentation) such that continued refocusing of the laser beam in the target material can continue over long distances. See FIG. 6.

Figure 7:
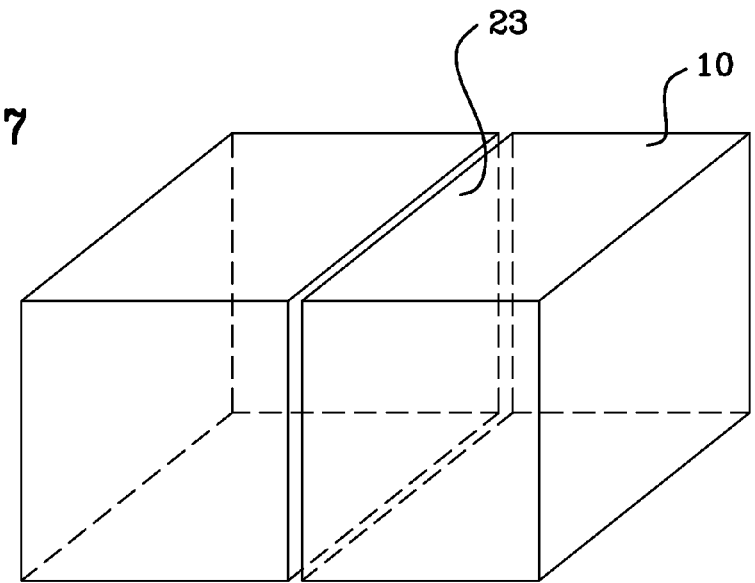
FIG. 7 is a perspective view of an orifice scribe in a transparent substrate formed by the laser machining arrangement of the present invention.

This distributed focusing method allows for the "dumping" or reduction of unnecessary energy from the incident beam 2 found at the principal focal waist 8 by the creation of secondary foci 24 by the distributed focusing elements assembly 26, and by positioning the location of the principal focal waist 8 from on or in the material, to outside the material 10. This dumping of beam fluence combined with the linear alignment of the principal focal waist 8 and secondary focal waists 24, enables the formation of filaments over distances well beyond those achieved to date using previously known methods (and well beyond 1 mm) while maintaining a sufficient laser intensity (fluence $\mu J/cm^2$) to accomplish actual modification and compression over the entire length of the filament zone. This distributed focusing method supports the formation of filaments with lengths well beyond one millimeter and yet maintaining an energy density beneath the optical breakdown threshold of the material with intensity enough so that even multiple stacked substrates can be drilled simultaneously across dissimilar materials (such as air or polymer gaps between layers of target material) with negligible taper over the drilled distance, (FIG. 7) and a relatively smooth walled orifice wall that can be initiated from above, below or within the target material. Propagating a non-tapered wall slit 23 in a target 10 is accomplished by the relative movement of the target 10 while machining an orifice.

The optical density of the laser pulse initiates a self focusing phenomena and generates a filament of sufficient intensity to non-ablative initial photoacoustic compression in a zone within/about/around the filament so as to create a linear symmetrical void of substantially constant diameter coincident with the filament, and also causes successive self focusing and defocusing of said laser pulse that coupled with the energy input by the secondary focal waists of the distributed beam forms a filament that directs/guides the formation of the orifice across or through the specified regions of the target material. The resultant orifice can be formed without removal of material from the target, but rather by a photoacoustic compression of the target material about the periphery of the orifice formed.

Figure 8:
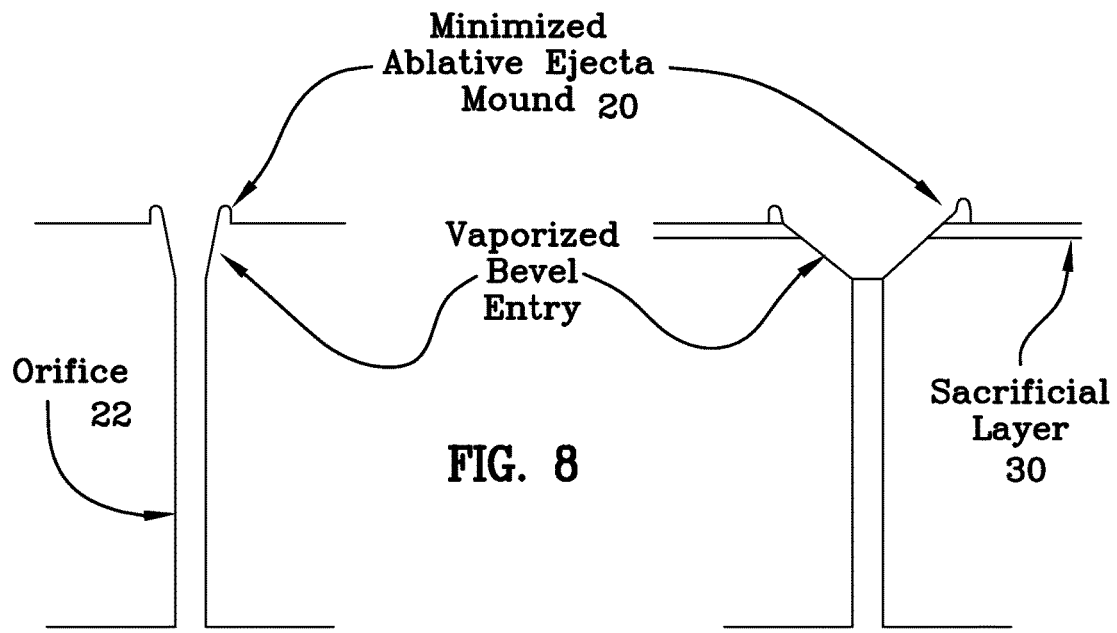
FIG. 8 is a representative side view of two orifices drilled by the laser arrangement of FIG. 6.

It is known that the fluence levels at the surface of the target 10 are a function of the incident beam intensity and the specific distributed focusing elements assembly, and are adjusted for the specific target material(s), target(s) thickness, desired speed of machining, total orifice depth and orifice diameter. Additionally, the depth of orifice drilled is dependent on the depth over which the laser energy is absorbed, and thus the amount of material removed by a single laser pulse, depends on the material's optical properties and the laser wavelength and pulse length. For this reason a wide range of process parameters are listed herein with each particular substrate and matching application requiring empirical determination for the optimal results with the system and materials used. As such, the entry point on the target 10 may undergo some minimal ablative ejecta mound formation 20 if the fluence levels at the surface are high enough to initiate momentary, localized ablative (vaporized) machining, although this plasma creation is not necessary. In certain circumstances it may be desirable to utilize a fluence level at the target surface that is intense enough to create the transient, momentary ablative drilling to give a broad bevelled entry yet have the remainder of the orifice 22 of uniform diameter FIG. 8 as would be created by a distributed focus hybrid drilling method using an energy level that permits a momentary ablative technique followed by a continual photoacoustic compression technique. This can be accomplished by the present invention by selection of a fluence level at the target surface that balances the linear absorption against the non linear absorption of the beam in the material such that the fluence level required for ablative machining will be exhausted at the desired depth of the bevelled (or other geometric configuration). This hybrid technique will result in a minor ejecta mound 20 that can be eliminated if a sacrificial layer 30 is applied to the target surface. Common sacrificial layers are resins or polymers such as but not limited to PVA, Methacrylate or PEG, and generally need only be in the range of 1 to 300 microns thick (although the 10-30 micron range would be utilized for transparent material machining) and are commonly applied by spraying the sacrificial layer onto the target material. The sacrificial layer will inhibit the formation of an ejecta mound on the target 10 by preventing molten debris from attaching itself to the surface, attaching instead to the removable sacrificial material as is well known in the art. See FIG. 8.

To accomplish photoacoustic compression machining requires the following system:

A burst pulse laser system capable of generating a beam comprising a programmable train of pulses containing from 1 to 50 subpulses within the burst pulse envelope. Further, the laser system needs to be able to generate average power from 1 to 200 watts depending on the target material utilized and typically this range would be in the range of 50 to 100 watts for borosilicate glass.

A distributed focusing element assembly (potentially comprising positive and negative lenses but having a positive focusing effect in the aggregate) capable of producing a weakly convergent, multi foci spatial beam profile where the incident fluence at the target material is sufficient to cause Kerr-effect self-focusing and propagation.

An optical delivery system capable of delivering the beam to the target.

Commercial operation would also require translational capability of the material (or beam) relative to the optics (or vice versa) or coordinated/compound motion driven by a system control computer.

The use of this system to drill photoacoustic compression orifices requires the following conditions be manipulated for the specific target(s): the properties of the distributed focus element assembly; the burst pulsed laser beam characteristics; and the location of the principal focus.

The distributed focus element assembly may be of a plethora of generally known focusing elements commonly employed in the art such as aspheric plates, telecentric lenses, non-telecentric lenses, aspheric lenses, axicon, annularly faceted lenses, custom ground aberrated (non-perfect) lenses, a combination of positive and negative lenses or a series of corrective plates (phase shift masking), any optical element tilted with respect to the incident beam, and actively compensated optical elements capable of manipulating beam propagation. The principal focal waist of a candidate optical element assembly as discussed above generally will not contain more than 90% nor less than 50% of incident beam fluence at the principal focal waist.

Although, in specific instances, the optical efficiency of the distributed focus element assembly 26 may approach 99%. FIG. 10 illustrates a non-aspherical, aberrated lens 34 as would be used in the aforementioned process. The actual optical efficiency of the distributed focus element assembly 26 will have to be fine-tuned for each specific application. The users will create a set of empirical tables tailored for each transparent material, the physical configuration and characteristics of the target as well as the specific laser parameters. Silicon Carbide, Gallium Phosphide, sapphire, strengthened glass etc. each has its own values. This table is experimentally determined by creating a filament within the material (adjusting the parameters of laser power, repetition rate, focus position and lens characteristics as described above) and ensuring that there is sufficient fluence to induce a plane of cleavage or axis of photoacoustic compression to create an orifice.

A sample optical efficiency for drilling a 1 micron diameter through orifice (as illustrated in FIG. 11) in a 2 mm thick single, planar target made of borosilicate, using a 50 Watt laser outputting 5 pulses (at 50 MHz) in each burst with 50 µJ energy having a frequency (repetition rate) that would lie in the 200 kHz range is 65% wherein the principal focal waist of the beam resides up to 500 µm off of the desired point of initiation.

Figure 12:
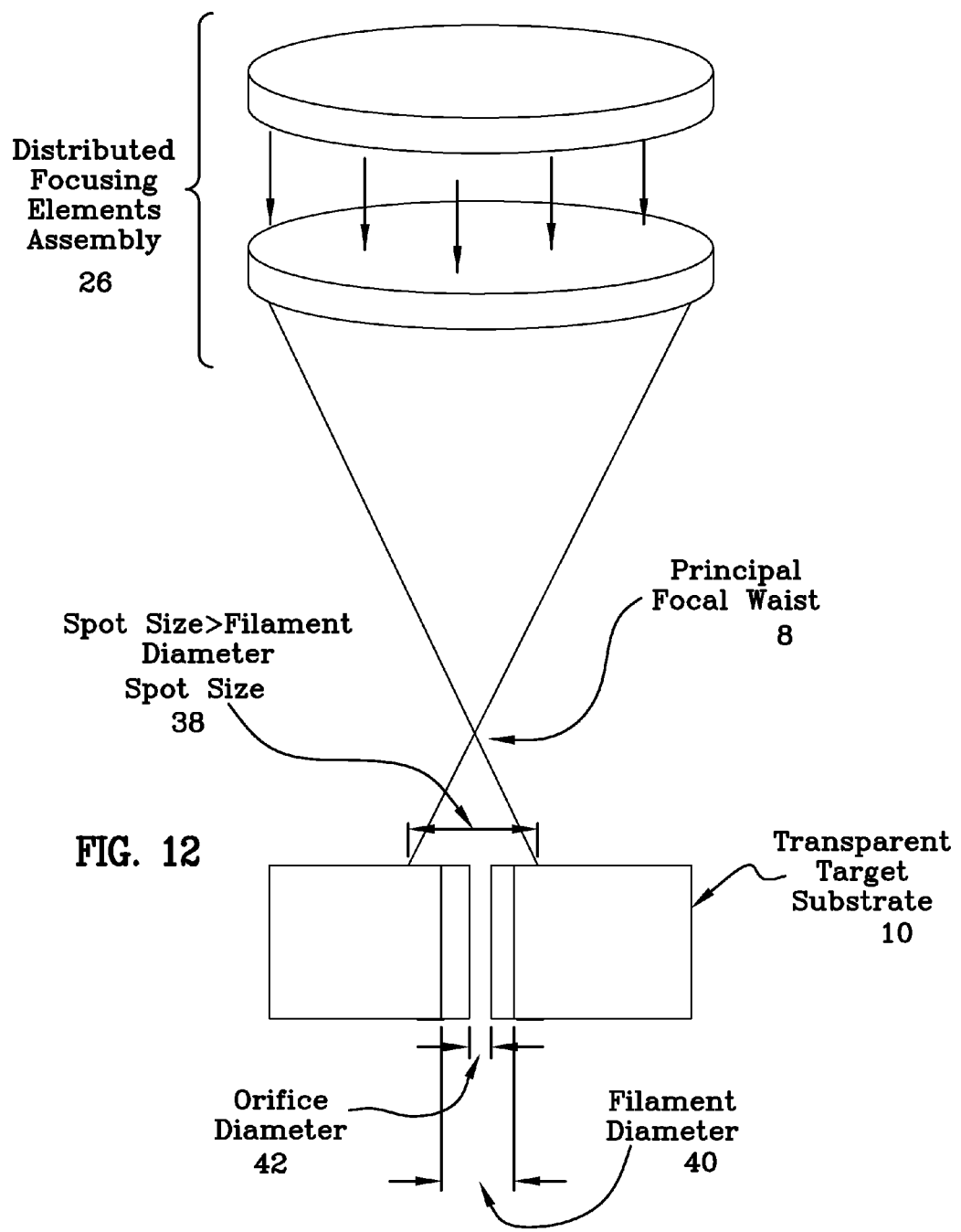
FIG. 12 is a diagrammatic view of the present invention utilizing a distributed focus lens arrangement.

It is to be noted that there is also a set of physical parameters that must be met by this photoacoustic compression drilling process. Looking at FIGS. 11 and 12 it can be seen that the beam spot diameter 38>the filament diameter 40>the orifice diameter 42. Additionally the distributed beam's primary focal waist 8 is never in or on the surface of the target material 10 into which a filament is created.

Figure 6:
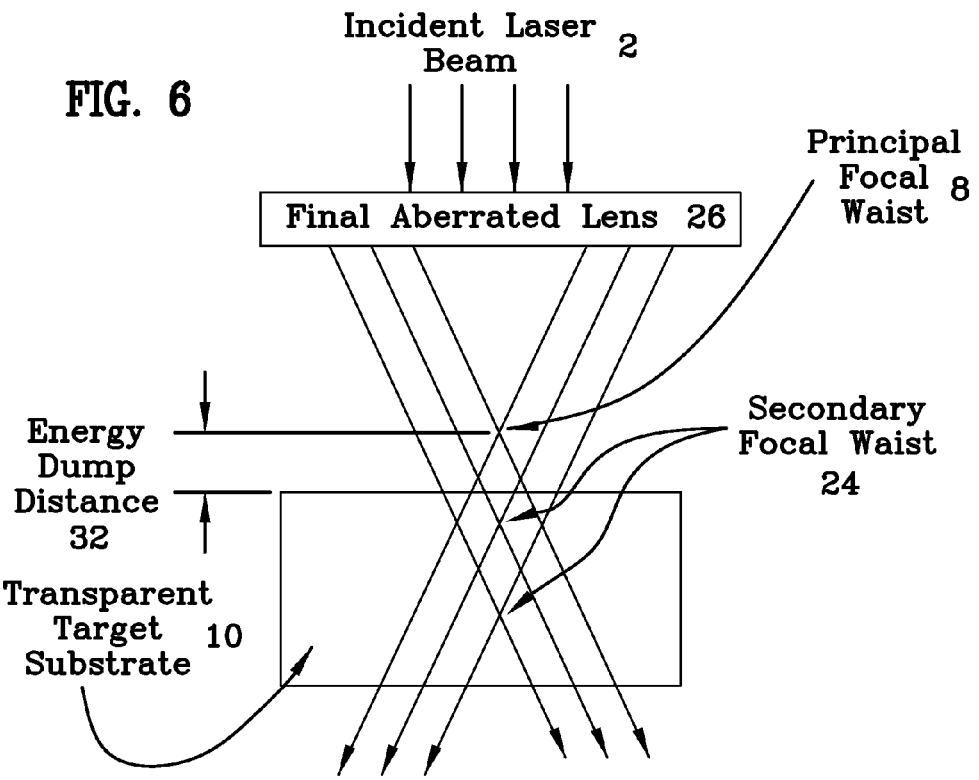
FIG. 6 is a diagrammatic representation of the laser machining arrangement of the present invention wherein the primary focus occurs above the top surface of the transparent substrate.

The location of the principal focal waist 8 is generally in the range of 5 to 500 µm off of the desired point of initiation. This is known as the energy dump distance 32 as illustrated in FIG. 6. It also is determined by the creation an empirical table tailored for each transparent material, the physical configuration and characteristics of the target as well as the laser parameters. It is extrapolated from the table created by the method noted above.

One example of the laser beam energy properties are as follows: a pulse energy in the beam between 5 µJ to 100 µJ at the repetition rate from 1 Hz to 2 MHz (the repetition rate defines the speed of sample movement and the spacing between neighboring filaments). The diameter and length of the filament may be adjusted by changing the temporal energy distribution present within each burst envelope.

Figure 17:
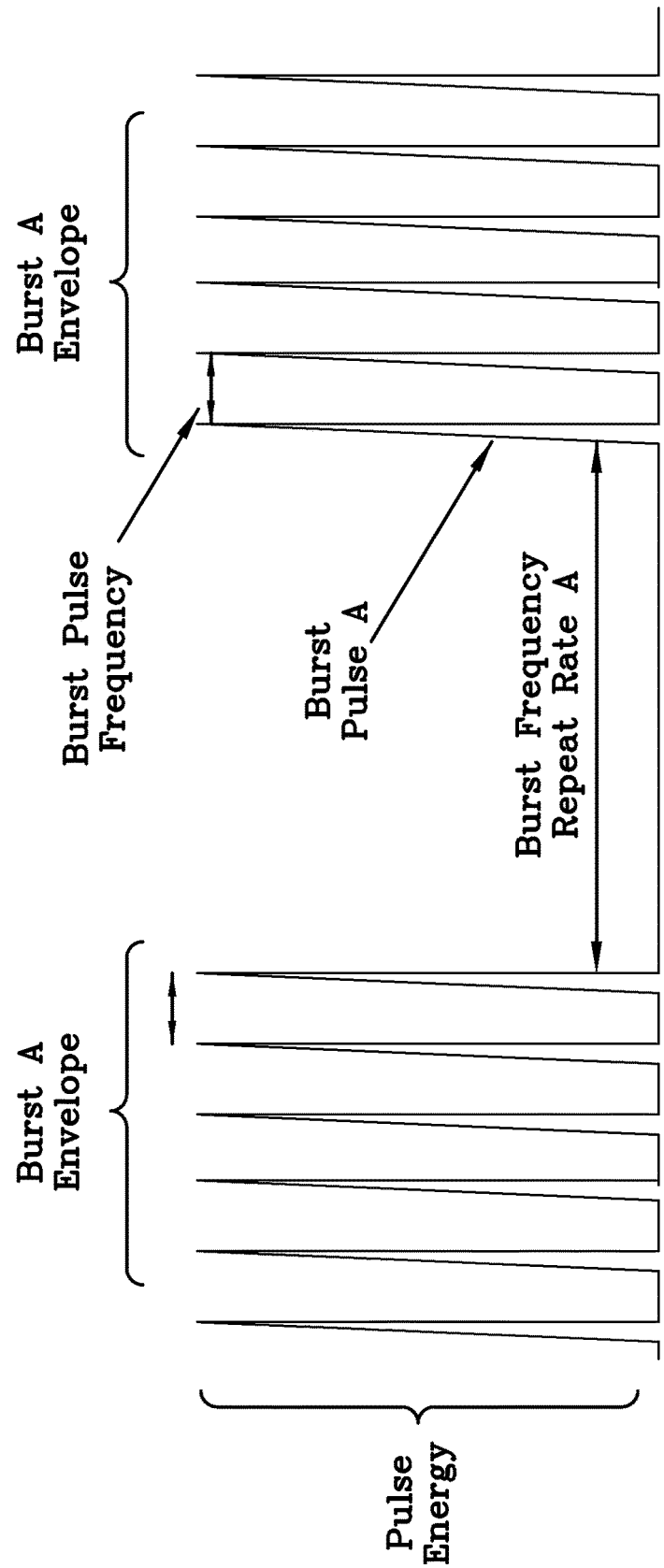
FIGS. 17-19 show three various configurations of the distribution of laser energy.
Figure 18:
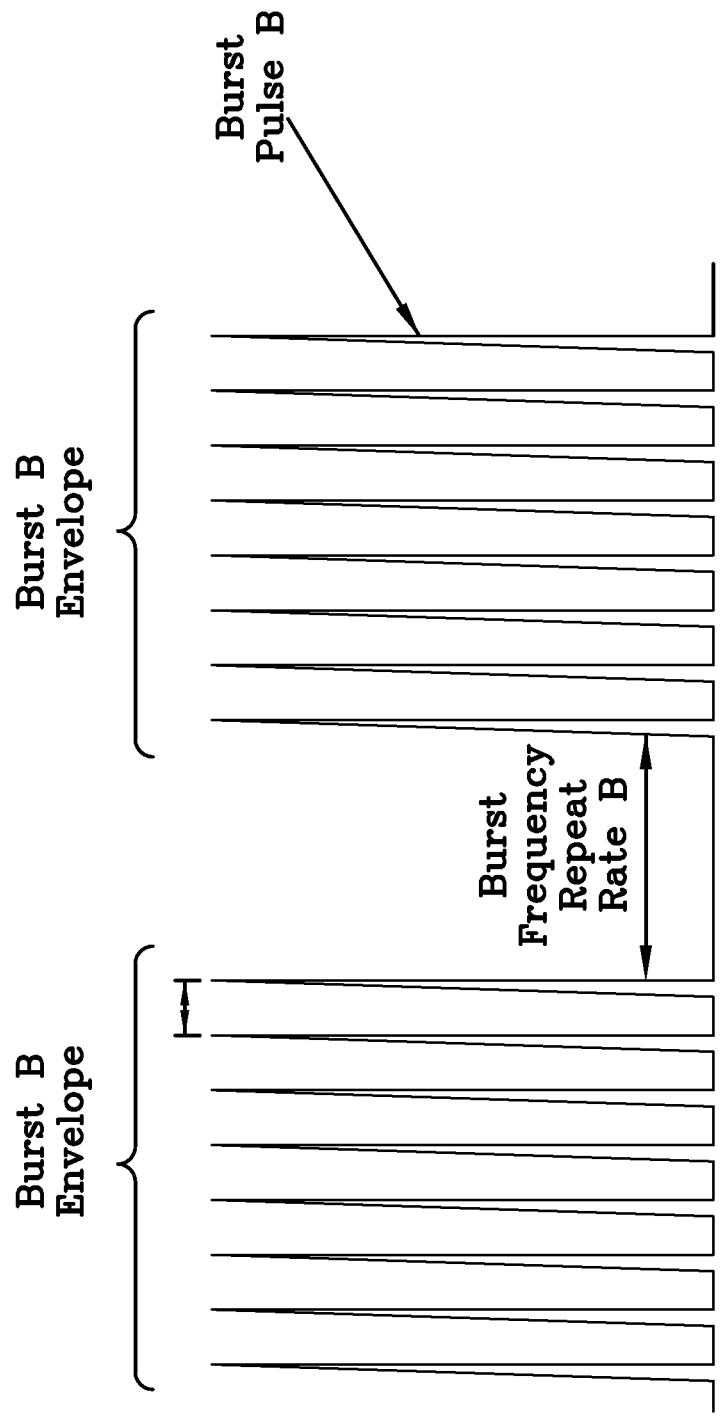
Figure 19:
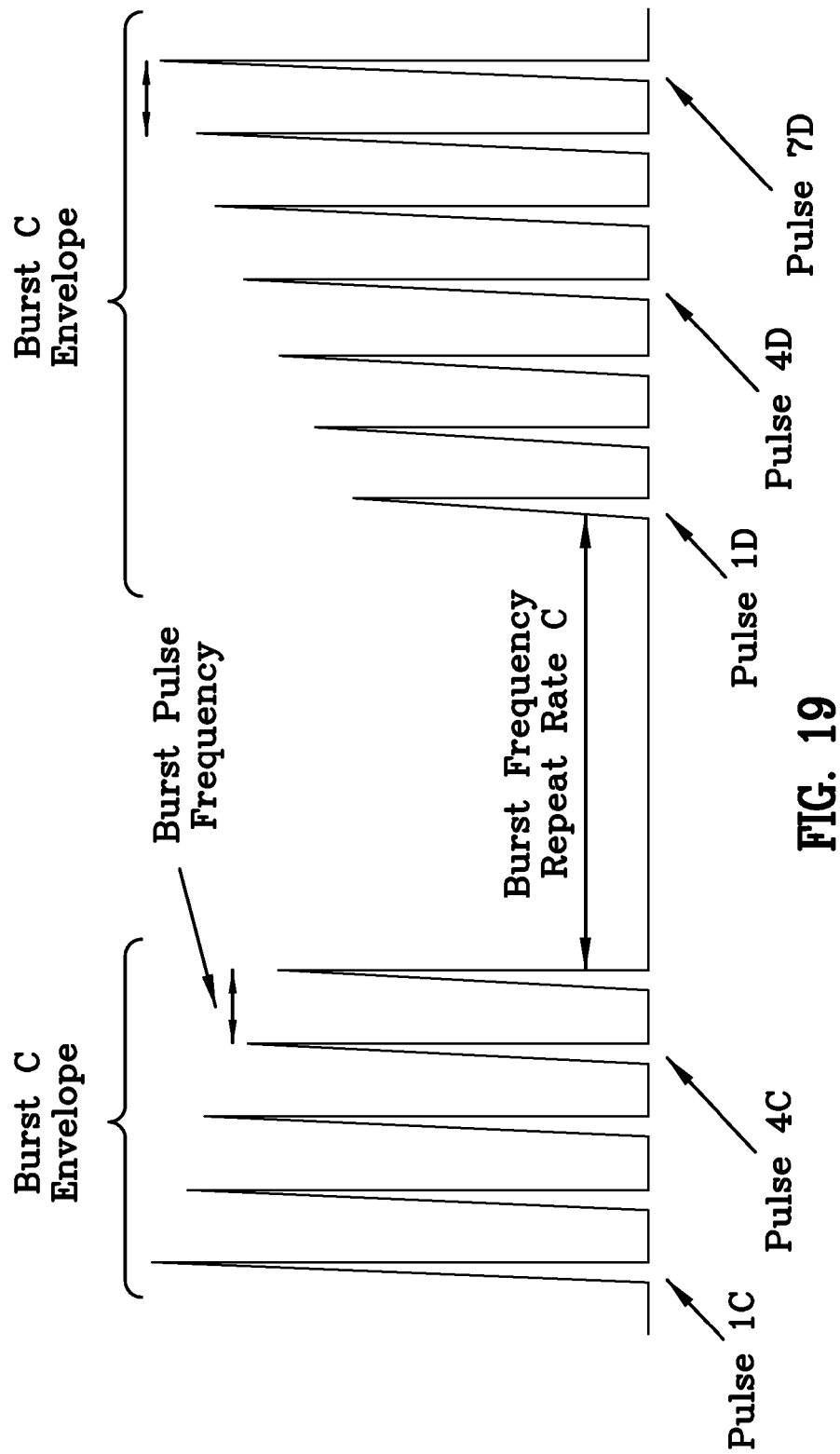

FIGS. 17-19 illustrate examples of three different temporal energy distributions of a burst pulsed laser signal. The rising and falling burst envelope profiles of FIG. 19 represent a particularly useful means of process control especially well adapted for removing thin metal layers from dielectric materials.

Looking at FIGS. 13-16 collectively, the mechanism of the present invention can best be illustrated. Herein, burst picosecond pulsed light is used because the total amount of energy deposited in the target material is low and photoacoustic compression can proceed without cracking the material, and less heat is generated in the target material thus efficient smaller packets of energy are deposited in the material so that the material can be raised incrementally from the ground state to a maximally excited state without compromising the integrity of the material in the vicinity of the filament.

The actual physical process occurs as described herein. The principal focal waist of the incident light beam of the pulsed burst laser is delivered via a distributed focusing element assembly to a point in space above or below (but never within) the target material in which the filament is to be created. This will create on the target surface a spot as well as white light generation. The spot diameter on the target surface will exceed the filament diameter and the desired feature (orifice, slot, etc.) diameter. The amount of energy thus incident in the spot on surface being greater than the critical energy for producing the quadratic electro-optic effect (Kerr effect—where the change in the refractive index of the material is proportional to the applied electric field) but is lower that the critical energy required to induce ablative processes and more explicitly below the optical breakdown threshold of the material. Photoacoustic compression proceeds as a consequence of maintaining the required power in the target material over time scales such that balancing between the self-focusing condition and plasma defocusing condition can be maintained. This photoacoustic compression is the result of a uniform and high power filament formation and propagation process whereby material is rearranged in favor of removal via ablative processes. The extraordinarily long filament thus produced is fomented by the presence of spatially extended secondary foci created by the distributed focusing element assembly, maintaining the self focusing effect without reaching optical breakdown. In this assembly, a large number of marginal and paraxial rays converge at different spatial locations relative to the principal focus. These secondary foci exist and extend into infinite space but are only of useful intensity over a limited range that empirically corresponds to the thickness of the target. By focusing the energy of the second foci at a lower level below the substrate surface but at the active bottom face of the filament event, allows the laser energy access to the bulk of the material while avoiding absorption by plasma and scattering by debris.

Figure 13:
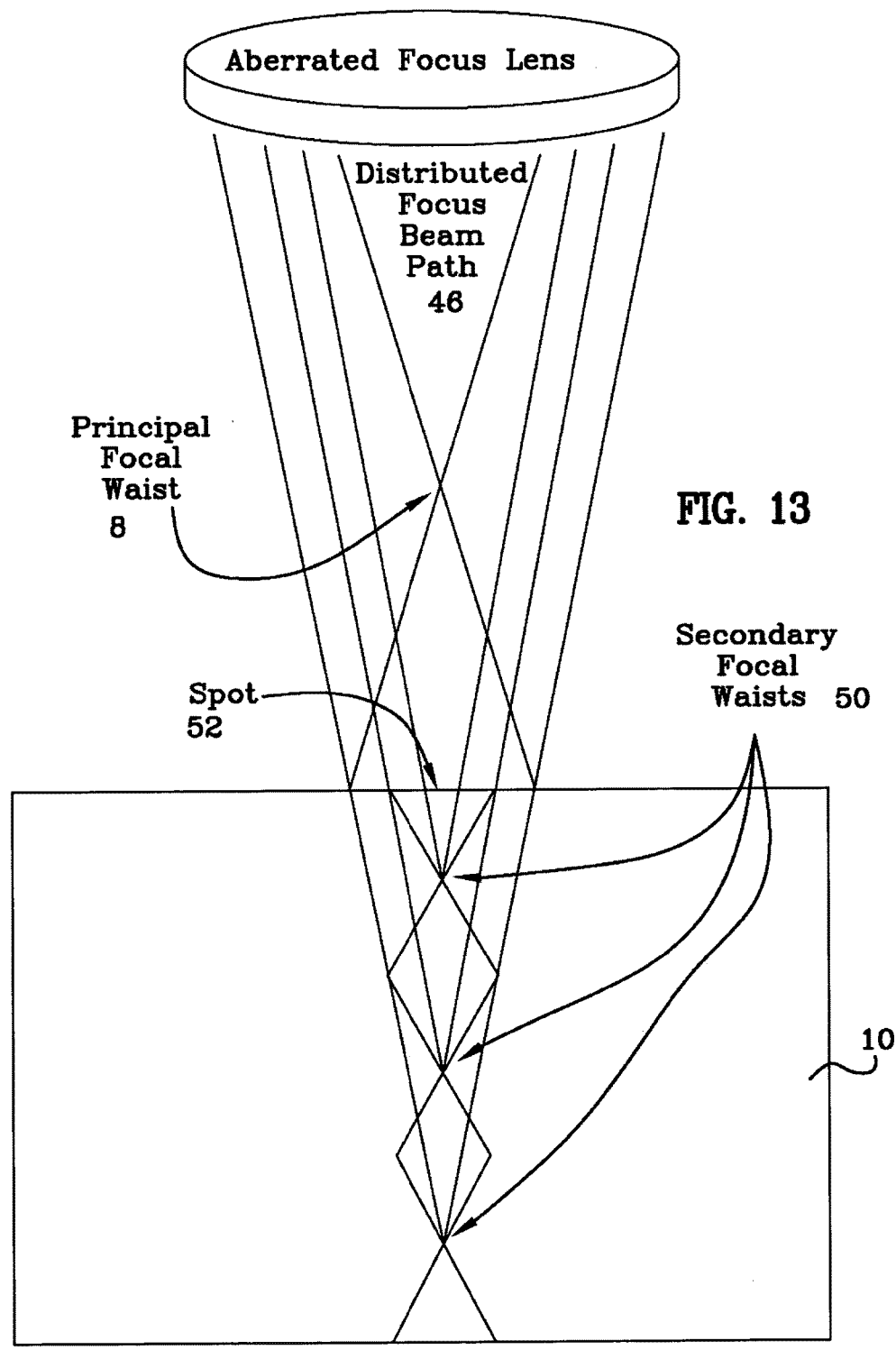
FIG. 13 is a diagrammatic view of the present invention utilizing a distributed focus lens arrangement and the distribution of focal waists where the principal focus is above the target.
Figure 14:
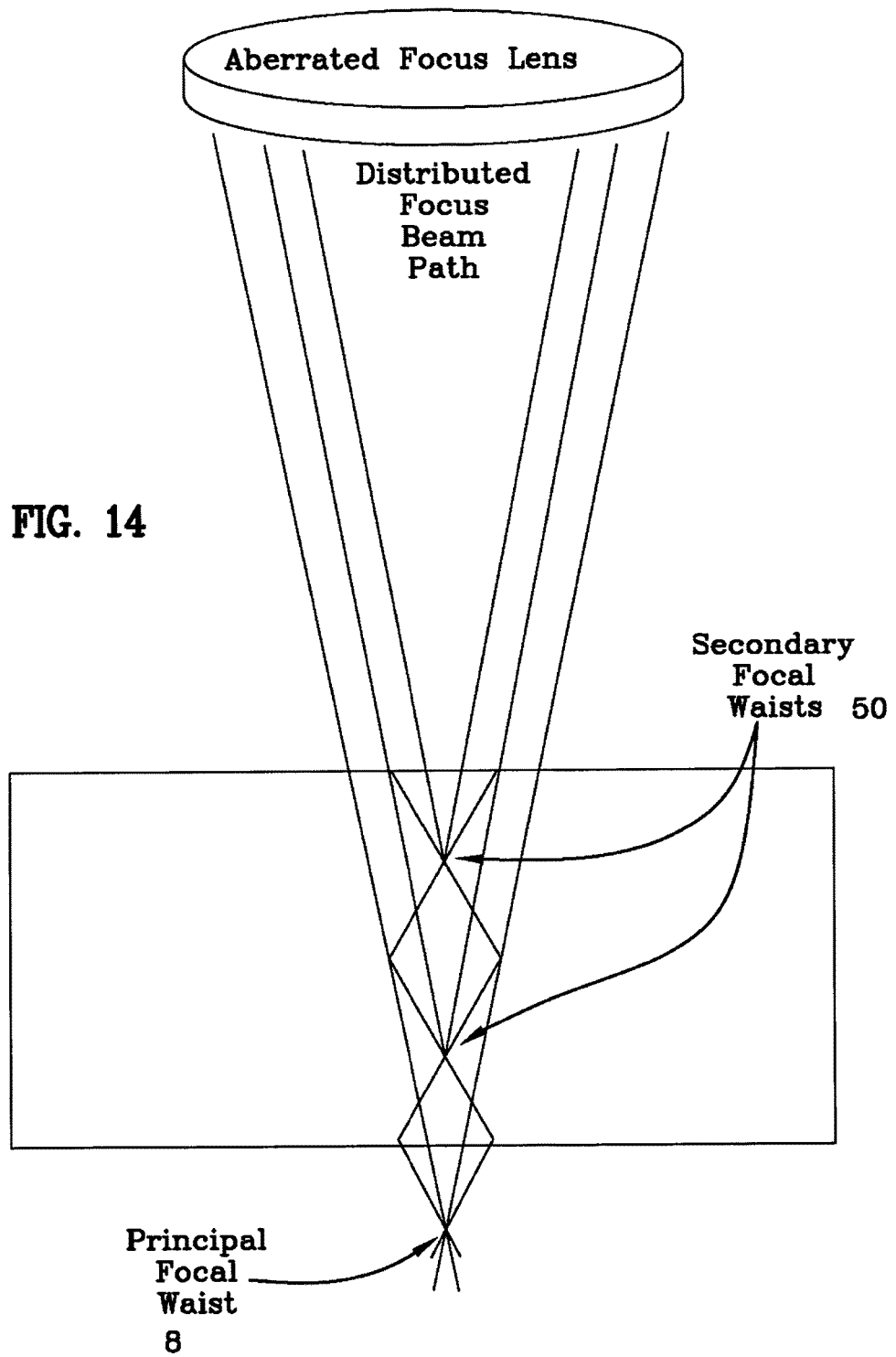
FIG. 14 is a diagrammatic view of the present invention utilizing a distributed focus lens arrangement and the distribution of focal waists where the principal focus is below the target.
Figure 15:
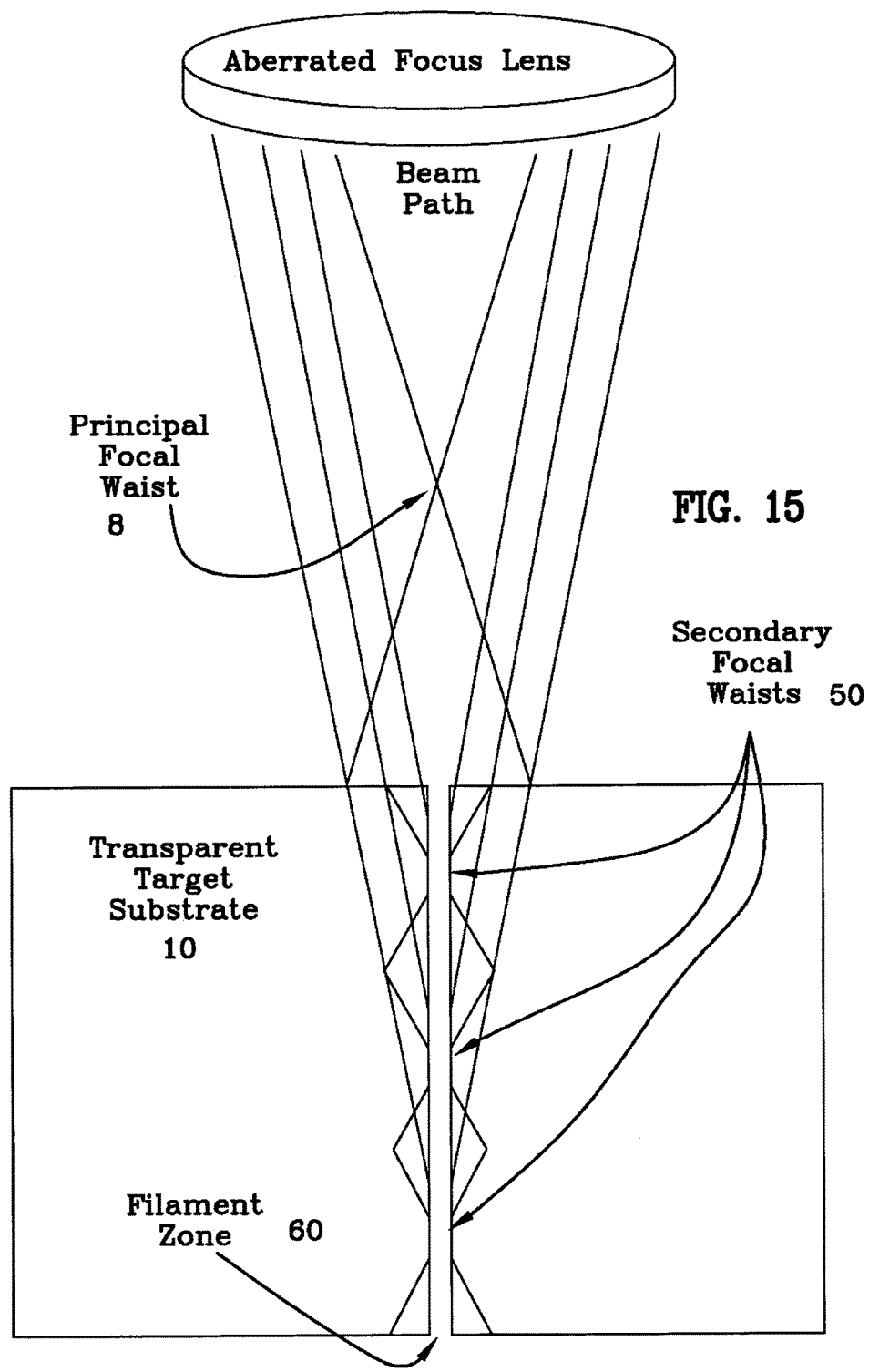
FIG. 15 is a diagrammatic view of the present invention of FIG. 13 wherein the orifice has been drilled.

The distributed focal element assembly can be a single aberrated focal lens placed in the path of the incident laser beam to develop what appears to be an unevenly distributed focus of the incident beam into a distributed focus beam path containing a principal focal waist and a series of linearly arranged secondary focal waists (foci). The alignment of these foci is collinear with the linear axis of the orifice 42. Note that the principal focal waist 8 is never on or in the target material 10. In FIG. 13 the principal focal waist is above the target material and in FIG. 14 it is below the target material 10 as the orifice 42 may be initiated above or below the principal focal waist 8 by virtue of the symmetric and non-linear properties of the focused beam. Thus a beam spot 52 (approximately 10 μm distance) resides on the surface of the target 10 and the weaker secondary focal waists collinearly reside within the target because the material acts as the final optical element creating these focal points as the electric field of the laser alters the indices of refraction of the target. This distributed focus allows the amount of laser energy to be deposited in the material so as to form a filament line or zone 60. See FIG. 15. With multiple linear aligned foci and by allowing the material to act as the final lens, the target material when bombarded with ultrafast burst pulse laser beams, undergoes numerous, successive, localized heatings which thermally induced changes in the material's local refractive index (specifically, the complex index) along the path of the liner aligned foci causing a lengthy untapered filament 60 to be developed in the target followed by an acoustic compression wave that annularly compresses the material in the desired region creating a void and a ring of compressed material about the filamentation path. Then the beam refocuses and the refocused beam combined with the energy at the secondary focal waists maintains the critical energy level and this chain of events repeats itself so as to drill an orifice capable of 1500:1 aspect ratio (length of orifice/diameter of orifice) with little to no taper and an entrance orifice size and exit orifice size that are effectively the same diameter. This is unlike the prior art that focuses the energy on the top surface of or within the target material resulting in a short filamentation distance until the optical breakdown is reached and filamentation degrades or ceases.

Figure 16:
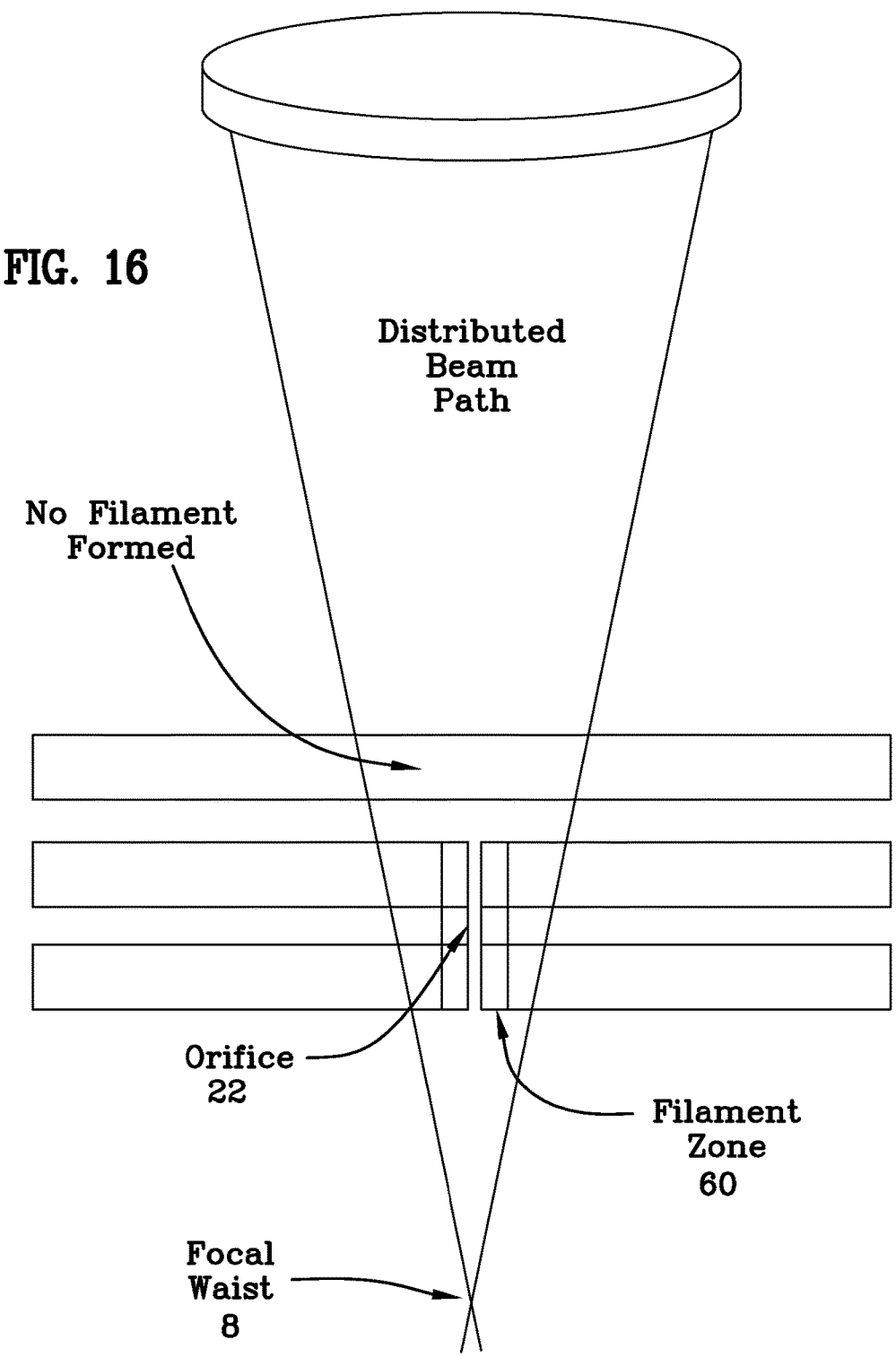
FIG. 16 is a diagrammatic view of the present invention utilizing a distributed focus lens arrangement and the distribution of focal waists where the principal focus is below multiple targets.

FIG. 16 illustrates the drilling of orifices in the bottom two of three planar targets 10 in a stacked configuration with an air gap between them wherein the principal focal waist 8 is positioned below the final target 10. The hole can be drilled from the top or the bottom or the middle of a multiple layer setup, but the drilling event always occurs the same distance from the principal focal waist if the same lens set and curvature is used. The focal waist is always outside of the material and never reaches the substrate surface.

The method of drilling orifices through photoacoustic compression is accomplished by the following sequence of steps:

1. passing laser energy pulses from a laser source through a selected distributive-focus lens focusing assembly;

2. adjusting the relative distance and or angle of said distributive-focus lens focusing assembly in relation to a laser source so as to focus the laser energy pulses in a distributed focus configuration to create a principal focal waist and at least one secondary focal waist;

3. adjusting the principal focal waist or the target such that the principal focal waist will not reside on or in the target that is being machined;

4. adjusting the focus such that the spot of laser fluence on the surface of the target that is located below or above said principal focal waist, has a diameter that is always larger than a diameter of a filamentation that is formed in the target;

5. adjusting the fluence level of the secondary focal waists are of sufficient intensity and number to ensure propagation of a photoacoustic compressive machining through the desired volume of the target;

6. applying at least one burst of laser pulses of a suitable wavelength, suitable burst pulse repetition rate and suitable burst pulse energy from the laser source to the target through the selected distributive-focus lens focusing assembly, wherein the total amount of pulse energy or fluence, applied to the target at a spot where the laser pulse contacts the point of initiation of machining on the target, is greater that the critical energy level required to initiate and propagate photoacoustic compression machining, yet is lower than the threshold critical energy level required to initiate ablative machining; and 7. stopping the burst of laser pulses when the desired machining has been completed.

As mentioned earlier, there may be specific orifice configurations wherein a tapered entrance to the orifice may be desired. This is accomplished by initiation of the orifice with a laser fluence level that is capable of ablative machining for a desired distance and completing the drilling with a laser fluence level below the critical level for ablative machining yet above the critical level for photoacoustic machining to the desired depth in that material. This type of orifice formation may also utilize the application of a removable sacrificial layer on the surface of the target. This would allow the formation of the ejecta mound onto the sacrificial layer such that the ejecta mound could be removed along with the sacrificial layer at a later time. Such an orifice drilled by a hybrid ablative and photoacoustic compression method of machining would be performed through the following steps, although the application of the sacrificial layer need be utilized and if utilized need not occur first:

1. applying a sacrificial layer to at least one surface of a target;

2. passing laser energy pulses from a laser source through a selected distributive-focus lens focusing assembly;

3. adjusting the relative distance and or angle of said distributive-focus lens focusing assembly in relation to a laser source so as to focus the laser energy pulses in a distributed focus configuration to create a principal focal waist and at least one secondary focal waist;

4. adjusting the principal focal waist or the target such that the principal focal waist will not reside on or in the target that is being machined;

5. adjusting the focus such that the spot of laser fluence on the surface of the target that is located below or above said principal focal waist;

6. adjusting the spot of laser fluence on the surface of the target such that it has a diameter that is always larger than a diameter of a filamentation that is to be formed in the target;

7. ensuring the fluence level of the secondary focal waists are of sufficient intensity and number to ensure propagation of a photoacoustic compressive machining through the desired volume of the target; and 8. applying at least one burst of laser pulses of a suitable wavelength, suitable burst pulse repetition rate and suitable burst pulse energy from the laser source to the target through the selected distributive-focus lens focusing assembly, wherein the total amount of pulse energy or fluence, applied to the target at a spot where the laser pulse contacts the point of initiation of machining on the target, is greater that the critical energy level required to initiate ablative machining to the desired depth and thereinafter the fluence energy at the bottom of the ablatively drilled orifice is greater than the critical energy level to initiate and propagate a filamentation and photoacoustic compression machining, yet is lower than the threshold critical energy level required to initiate ablative machining; and 9. stopping the burst of laser pulses and filamentation when the desired machining has been completed.

The various parameters of the laser properties, the location of the principal focal waist, and the final focusing lens arrangements as well as the characteristics of the orifice created are set forth in the following table. It is to be noted that they are represented in ranges as their values vary greatly with the type of the target material, its thickness and the size and location of the desired orifice. The following chart details the ranges of the various system variables used to accomplish the drilling of uniform orifices in any of a plethora of transparent materials.

| Laser Properties | |
| --- | --- |
| Wavelength | 5 microns or less |
| Pulse width | 10 nanoseconds or less |
| Freq (laser pulse repetition rate) | 1 Hz to 2 MHz |
| Average power | 200-1 watt |
| Number of sub pulses per burst | 1 to 50 |
| Sub pulse spacing | 1 nanosecond to 10 microsecond |
| Pulse energy | 5 micro Joules (µJ) to 500 micro Joules (µJ) (Average power/repetition rate) watts/1/sec |
| Orifice Properties | |
| Min Orifice Diameter | .5 microns |
| Max Orifice Diameter | 50 microns |
| Max Orifice Depth | 10 mm in borosilicate glass |
| Typical Aspect Ratio | 1500:1 |
| Max Aspect Ratio | 2500:1 |
| Aberrated lens ratio | where the Cx:Cy ratio of the lenses are (−5 to 4,000) |
| Orifice Sidewall Smoothness (Material Independent) | <5 micron ave. roughness (e.g., Si, SiC, SiN, GaAs, GaN, InGaP) |
| Orifice Side Wall Taper (Material Independent) | Negligible across 10,000 micron depth |
| Beam Properties | |
| Focal Distribution | −5 to 4,000 |
| $M^2$ | 1.00-5.00 |

As noted earlier the parameters above vary with the target. In the way of an operational example, to drill a 3 micron hole 2 mm deep in a transparent substrate the following apparatus and parameters would be used: a 1064 nm wavelength laser, 64 Watts average power, 100 kHz repetition rate, 80 µJ pulse energy, and, 8 subpulses at a frequency of 50 MHz within the burst envelope.

The pulse power assuming a pulse width of 10 picoseconds, for example, is 800 divided by 10 picoseconds, which yields 8 MW (MW=Mega Watts). This would be focused with an aberrated lens delivering distributed foci over 2 mm of space (filament active zone is 2 mm long) focusing 5 to 500 µm above or below the surface of the substrate.

The Laser Machining System

Figure 20:
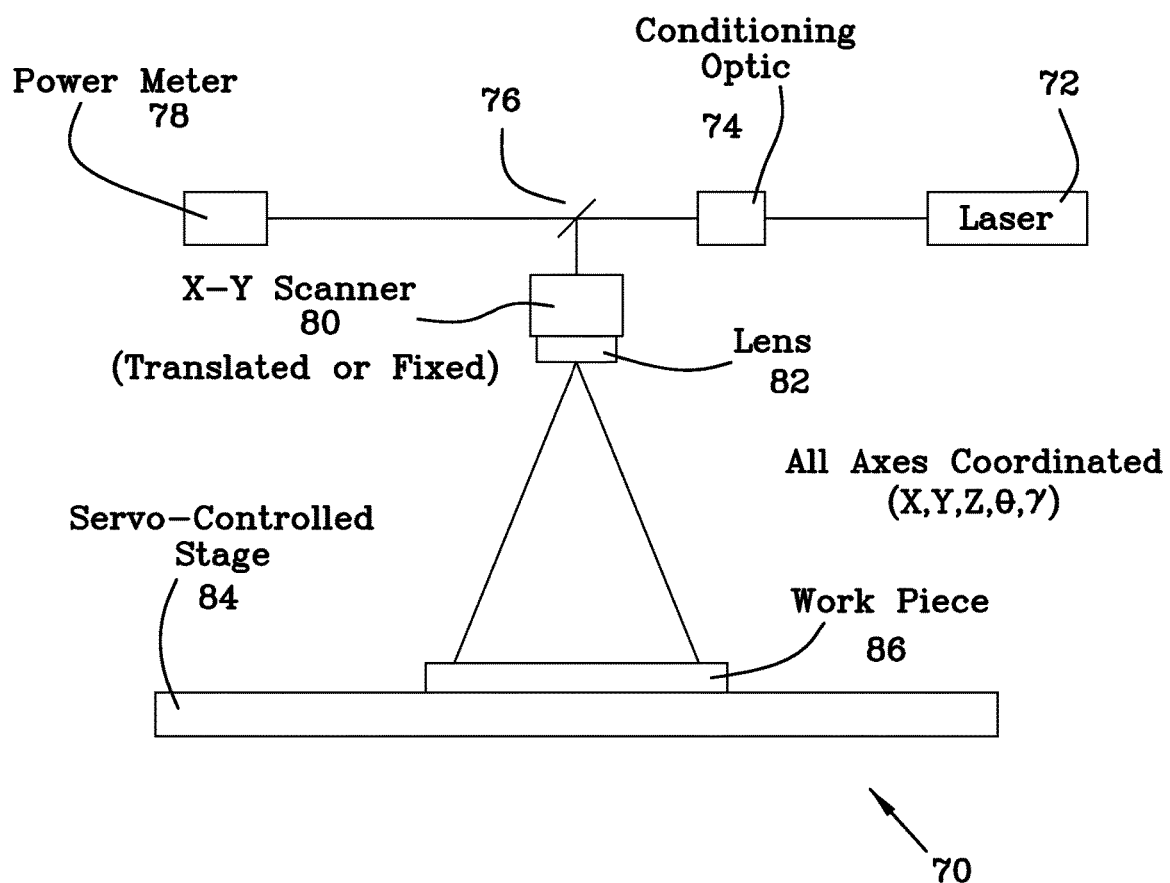
FIG. 20 is a diagrammatic representation of a laser machining system.

It is well known in the art that there are several types of laser machining systems currently available. All the laser machining systems have at least two things in common; they change the location of the incident laser beam on the work piece and they allow for the adjustment of the various laser focusing, power and delivery parameters. The system may move the work piece about the laser beam (for example, through a table translatable in the X-Y plane), may move the laser beam about the work piece (for example, through steering mirrors) or may utilize a combination of both techniques. FIG. 20 represents an example of a laser machining system 70 capable of forming filaments in the glass substrate of HDD platters or sheets. It includes an ultrafast laser 72 capable of supplying a train of burst-mode pulses, preferably with a pulse width less than 100 picoseconds, equipped with a suitable collection of beam steering optics, such that the laser beam can be delivered to a multi-axis rotation and translation stage including: a rotational stage in the XY plane (theta, θ), a 3D XYZ translational stage, and an axis for tipping the beam or the part relative to the X axis (gamma, γ) in a coordinated control architecture. In the example embodiment shown, the beam is manipulated by conditioning optic 74 (e.g. a positive or negative lens or combination of lenses capable of delivering a weakly focused spot that can be further conditioned or manipulated), beam sampling mirror 76, power meter 78, X-Y scanner 80, final focusing lens 82, and servo-controlled stage 84 for positioning workpiece 86, for example a substrate having circuit elements thereon and therein and therethrough. Control and processing unit 88, which is described in further detail below, is employed for the control of the laser filamentation and cutting system embodiment 70 disclosed herein. Filament position and depth may be controlled by an auto-focus configuration (e.g. using a position-sensing device) that maintains a constant working distance.

Figure 21:
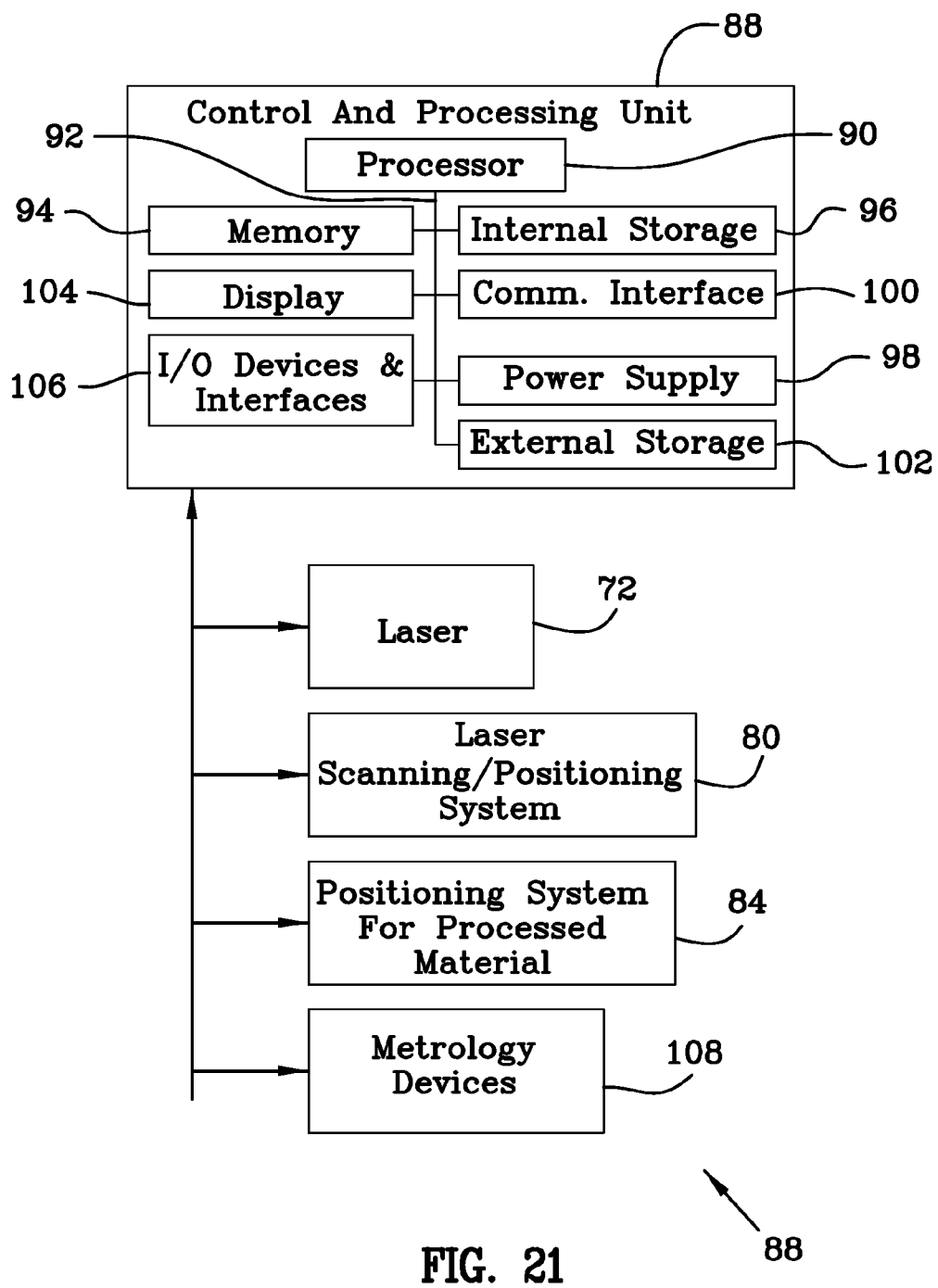
FIG. 21 is a diagrammatic representation of the control and processing unit for the laser machining system of FIG. 20.

FIG. 21 provides an example implementation of control and processing unit 88, which includes one or more processors 90 (for example, a CPU/microprocessor), bus 92, memory 94, which may include random access memory (RAM) and/or read only memory (ROM), one or more optional internal storage devices 96 (e.g. a hard disk drive, compact disk drive or internal flash memory), a power supply 98, one more optional communications interfaces 100, optional external storage 102, an optional display 104, and various optional input/output devices and/or interfaces 106 (e.g., a receiver, a transmitter, a speaker, an imaging sensor, such as those used in a digital still camera or digital video camera, an output port, a user input device, such as a keyboard, a keypad, a mouse, a position tracked stylus, a position tracked probe, a foot switch, and/or a microphone for capturing speech commands). Control and processing unit 88 is interfaced with one or more of laser system 72, laser scanning/position system 80, the servo-controlled stage 84 (positioning system for the substrate), and one or more metrology devices or systems 108, such as one or more metrology sensors or imaging devices.

Although only one of each component is illustrated in FIG. 21, any number of each component can be included in the control and processing unit 88. For example, a computer typically contains a number of different data storage media. Furthermore, although bus 92 is depicted as a single connection between all of the components, it will be appreciated that the bus 92 may represent one or more circuits, devices or communication channels which link two or more of the components. For example, in personal computers, bus 92 often includes or is a motherboard.

In one embodiment, control and processing unit 88 may be, or include, a general purpose computer or any other hardware equivalents. Control and processing unit 88 may also be implemented as one or more physical devices that are coupled to processor 90 through one of more communications channels or interfaces. For example, control and processing unit 88 can be implemented using application specific integrated circuits (ASICs). Alternatively, control and processing unit 88 can be implemented as a combination of hardware and software, where the software is loaded into the processor from the memory or over a network connection.

Control and processing unit 88 may be programmed with a set of instructions which when executed in the processor 90 causes the system to perform one or more methods described in the disclosure. Control and processing unit 88 may include many more or less components than those shown. Although not illustrated, 3D modeling systems that prepare the entire series of cuts that will be performed on the substrate based on parameters input such as volume efficiency, reflectivity, and division efficiency may also be incorporated into the processing unit.

While some embodiments have been described in the context of fully functioning computers and computer systems, those skilled in the art will appreciate that various embodiments are capable of being distributed as a program product in a variety of forms and are capable of being applied regardless of the particular type of machine or computer readable media used to actually effect the distribution.

A computer readable medium can be used to store software and data which when executed by a data processing system causes the system to perform various methods. The executable software and data can be stored in various places including for example ROM, volatile RAM, non-volatile memory and/or cache. Portions of this software and/or data can be stored in any one of these storage devices. In general, a machine readable medium includes any mechanism that provides (i.e., stores and/or transmits) information in a form accessible by a machine (e.g., a computer, network device, personal digital assistant, manufacturing tool, any device with a set of one or more processors, etc.).

Examples of computer-readable media include but are not limited to recordable and non-recordable type media such as volatile and non-volatile memory devices, read only memory (ROM), random access memory (RAM), flash memory devices, floppy and other removable disks, magnetic disk storage media, optical storage media (e.g., compact discs (CDs), digital versatile disks (DVDs), etc.), among others. The instructions can be embodied in digital and analog communication links for electrical, optical, acoustical or other forms of propagated signals, such as carrier waves, infrared signals, digital signals, and the like.

Some aspects of the present disclosure can be embodied, at least in part, in software. That is, the techniques can be carried out in a computer system or other data processing system in response to its processor, such as a microprocessor, executing sequences of instructions contained in a memory, such as ROM, volatile RAM, non-volatile memory, cache, magnetic and optical disks, or a remote storage device. Further, the instructions can be downloaded into a computing device over a data network in a form of compiled and linked version. Alternatively, the logic to perform the processes as discussed above could be implemented in additional computer and/or machine readable media, such as discrete hardware components as large-scale integrated circuits (LSI's), application-specific integrated circuits (ASIC's), or firmware such as electrically erasable programmable read-only memory (EEPROM's) and field-programmable gate arrays (FPGAs).

Figure 22:
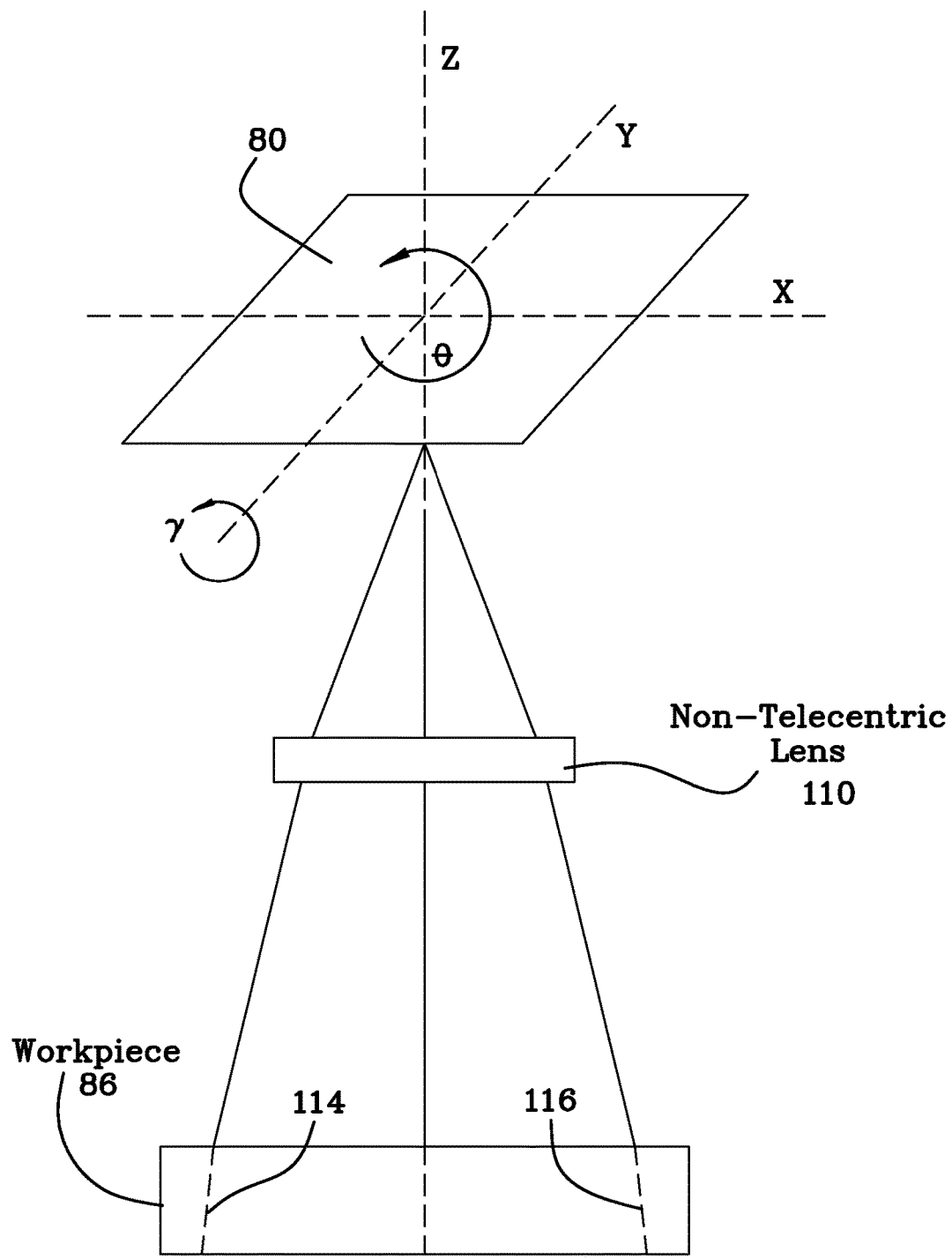
FIGS. 22 and 23 illustrate the X-Y scanner, using non-telecentric and telecentric lenses.
Figure 23:
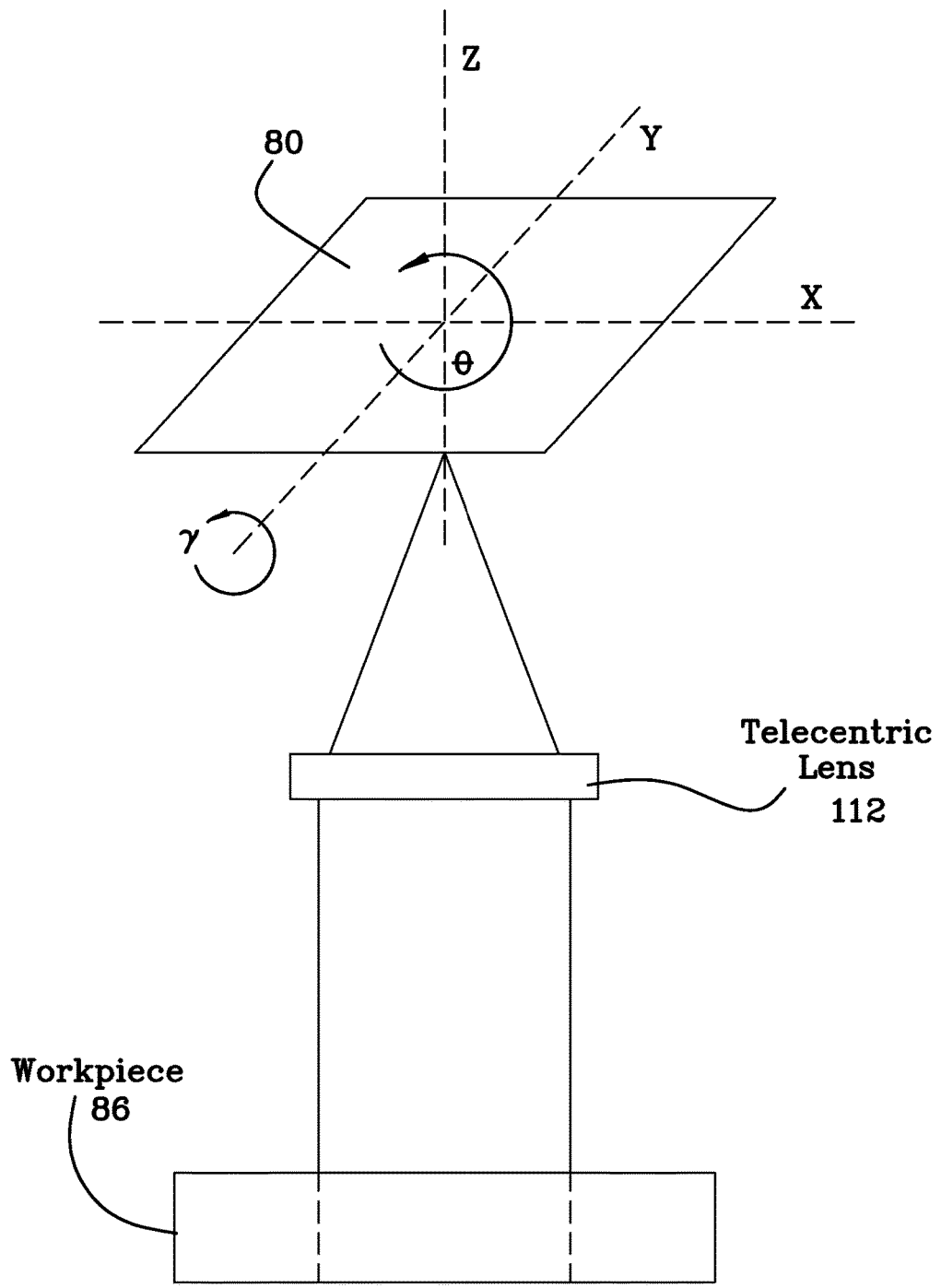

FIGS. 22 and 23 illustrate example embodiments showing the ability to control multiple axes via a control of stage of the X-Y scanner 80, using non-telecentric 110 lens (FIG. 22) and telecentric lens 112 (FIG. 23). In the case of a non-telecentric lens 110, angled filament paths can be created by the natural distortion present in a non-field-corrected lens. Rotation about the X (gamma) axis may be performed to provide angled filament modified zones (114, 116) within workpiece 86, for instance, the substrate with circuits thereon and therein. It is to be understood that other optical configurations are possible.

Figure 24:
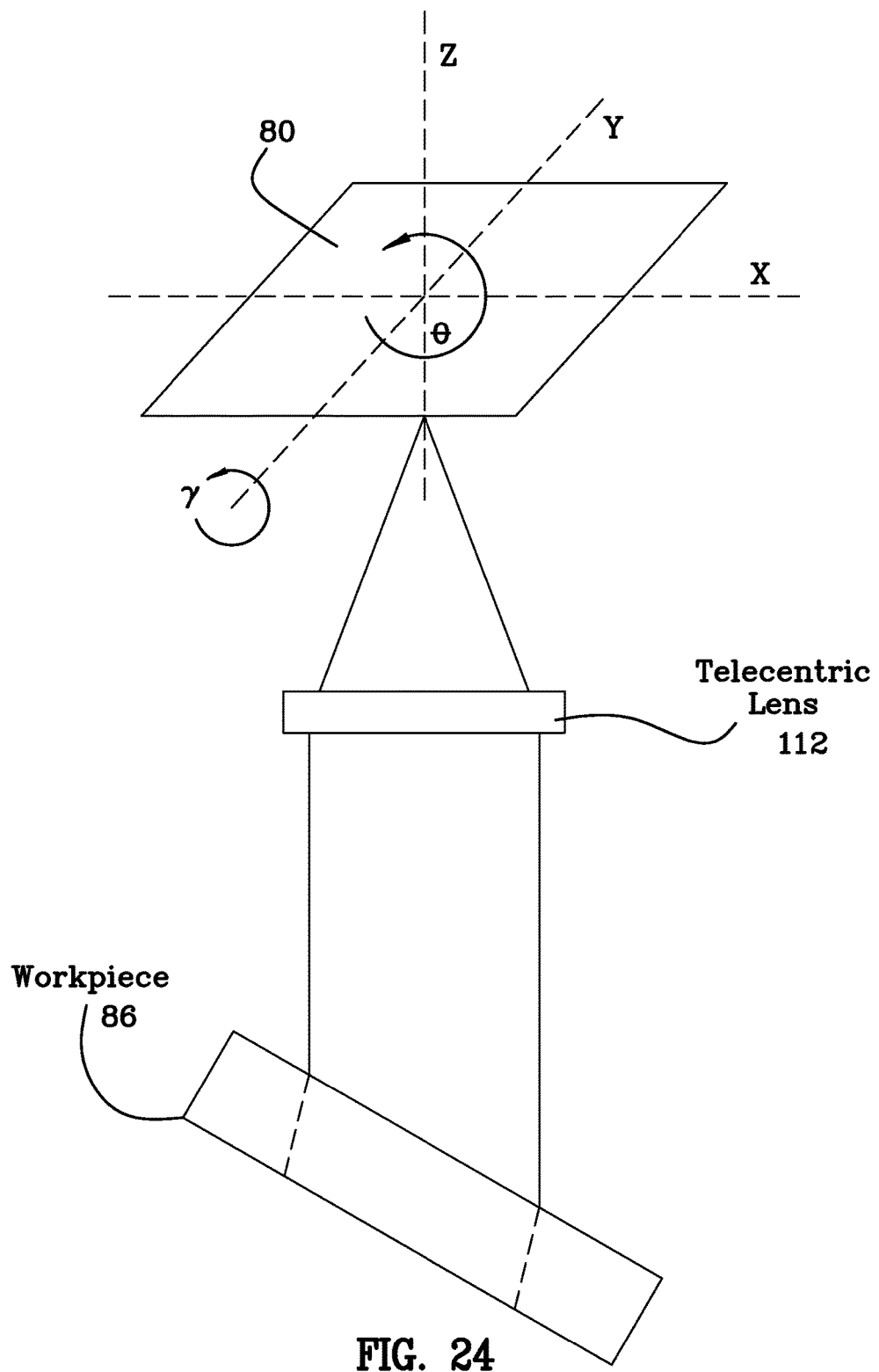
FIG. 24 illustrates an alternative embodiment producing filaments that are angled relative to the work piece material's surface.

FIG. 24 illustrates an alternative embodiment in which the servo controlled stage 84 (not illustrated) supporting the workpiece 86 is rotated to produce filaments that are angled relative to the workpiece material's surface, for instance the surface of substrate. This embodiment is configured to present a tilted sample with respect to the beam incidence angle for producing results similar to apparatus embodiments employing a scan lens.

Figure 25:
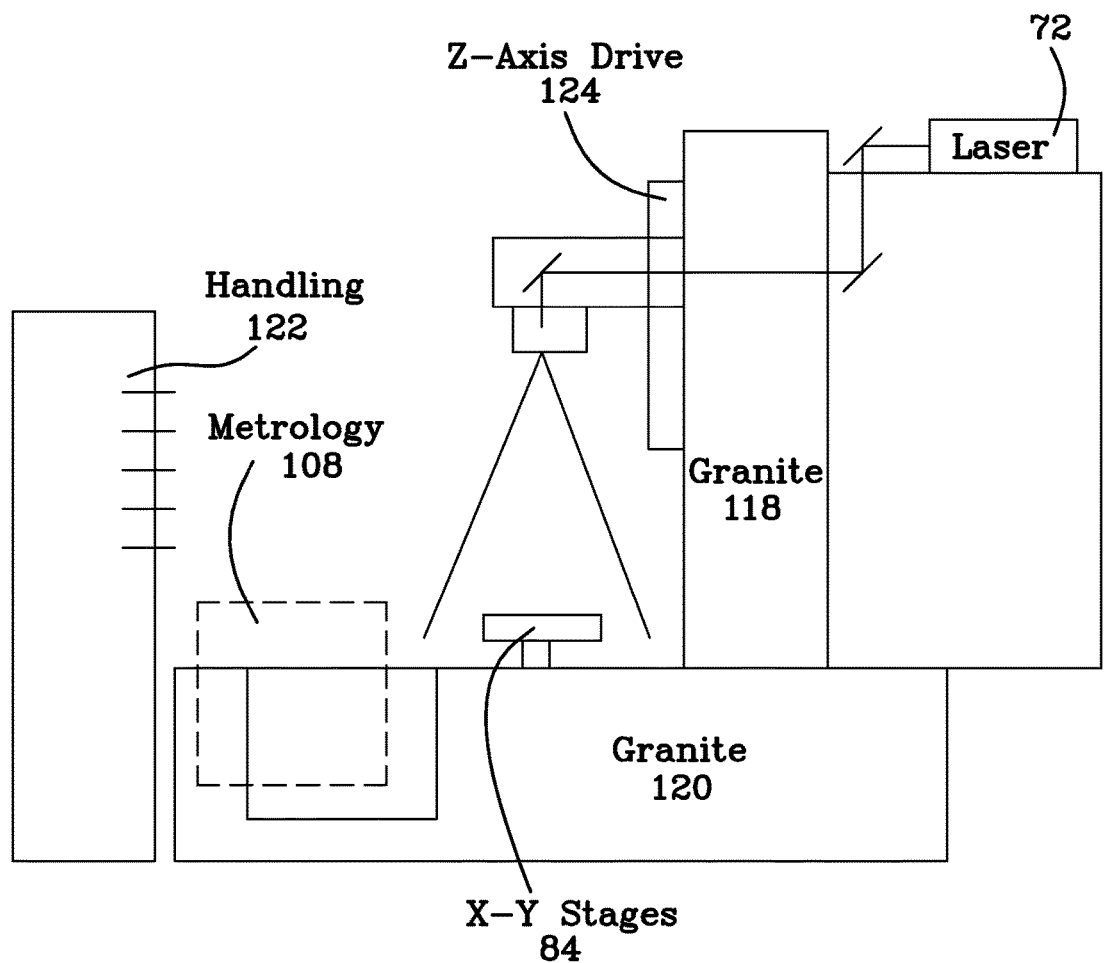
FIG. 25 illustrates the layout of an example laser system suitable for part singulation.

FIG. 25 illustrates the layout of an example laser system suitable for part singulation. Laser 72 is capable of delivering burst pulses, for example, with energies in the range of approximately 5 µJ-500 µJ, at repetition rates in the approximate range of 2.5-50 MHz. Increasing the number of pulses in a burst envelope increases the average power and prevents damage to the optics. For instance, as illustrated in FIGS. 17-19 multiple subpulses may be used in a burst envelope wherein each pulse has lower individual energy but the total energy per repetition is increased substantially. In this way, the optics are protected from damage due to excessive power levels.

Granite riser 118 is designed to be a reactive mass for dampening mechanical vibrations, as is commonly used in industry. This could be a bridge on which the optics above the stage can translate along one axis, X or Y relative to the stage, and in coordination with it. Granite base 120 provides a reactive mass that may support any or all components of system. In some embodiments, handling apparatus 122 is vibrationally decoupled from the system for stability reasons.

Z axis motor drive 124 is provided for translating the optics (conditioning and focusing and scan optics if needed) in the Z axis relative to the servo controlled X-Y stage 84. This motion can be coordinated with the XY stage 84 and X or Y motion in the overhead granite bridge, and the XY motion of the stage on the granite base 120, which holds the sample material to be processed.

Stage 84 includes, for example, XY and Theta stages with a tilt axis, gamma ("yaw"). The motion of stages 84 is coordinated by a control computing system, for example, to create a part shape desired from a larger mother sheet. Metrology device 108 provides post processing or preprocessing (or both) measurements, for example, for mapping, sizing, and/or checking edges quality post cut.

FIGS. 26(a)-(d) show the angled cut out approach for making internal features with angled edges requiring no post singulation processing to achieve the desired angular result.

Figure 26A:
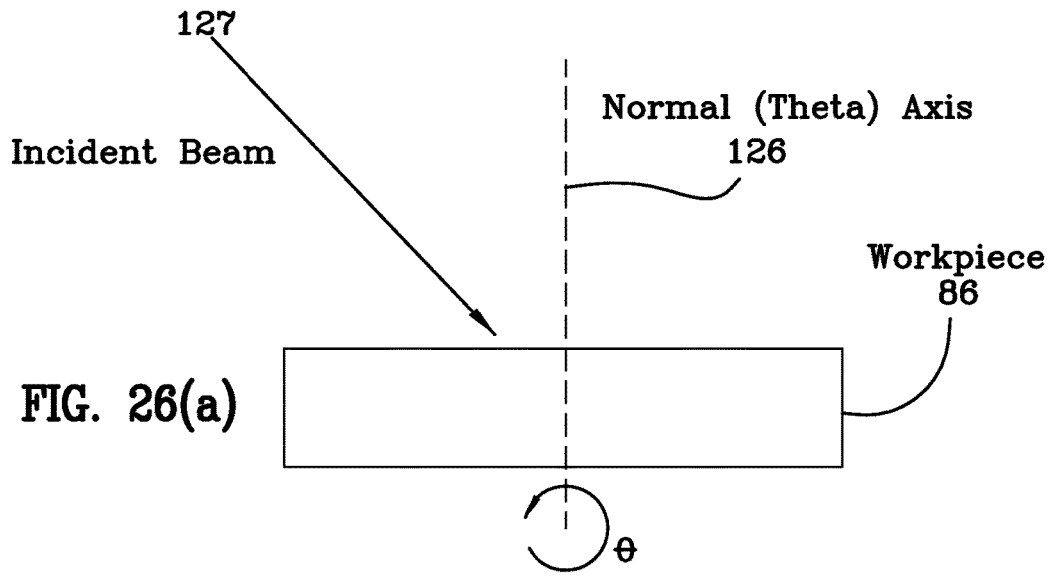
FIGS. 26(*a-d*) show the angled cut out approach for making angled edges as shown in FIG. 26(*e*)
Figure 26B:
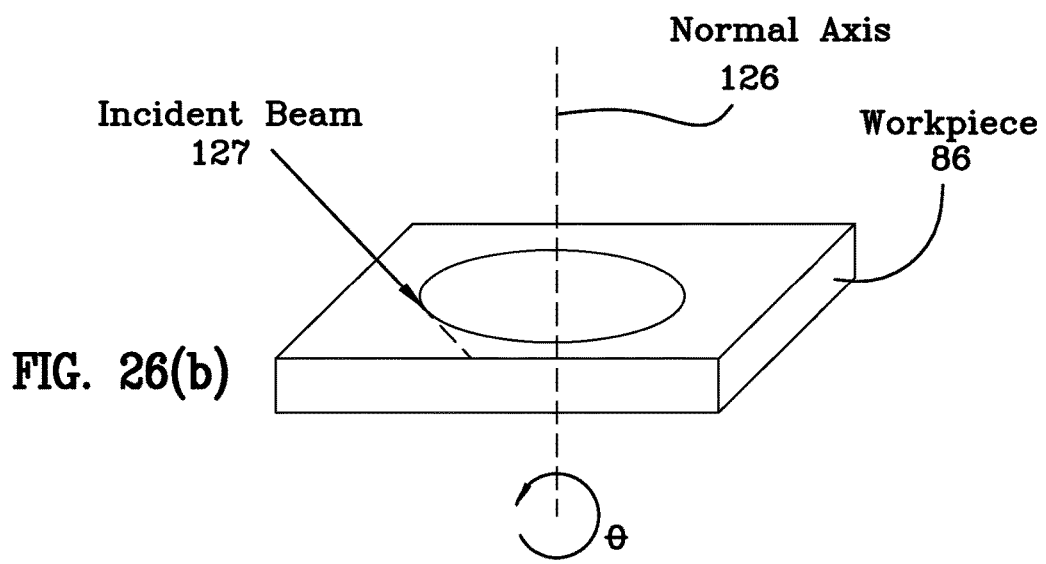
Figure 26C:
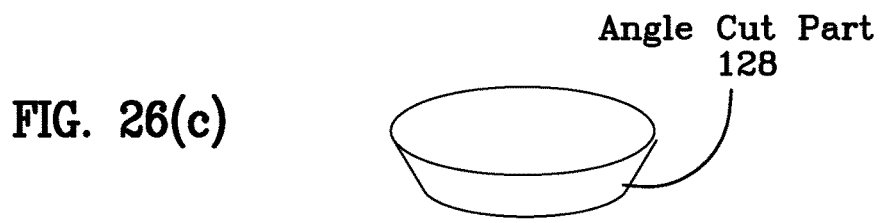

In FIGS. 26(a)-(c), the beam track is accomplished via rotation around the theta axis 126 with a fixed incidence angle laser beam 127, equal to the slope desired on the final part edge 128. This non-limiting embodiment enables angled cutting and translation of the rotary stage as an apparatus to support the creation of complex cutouts via filament arrays.

Figure 26D:
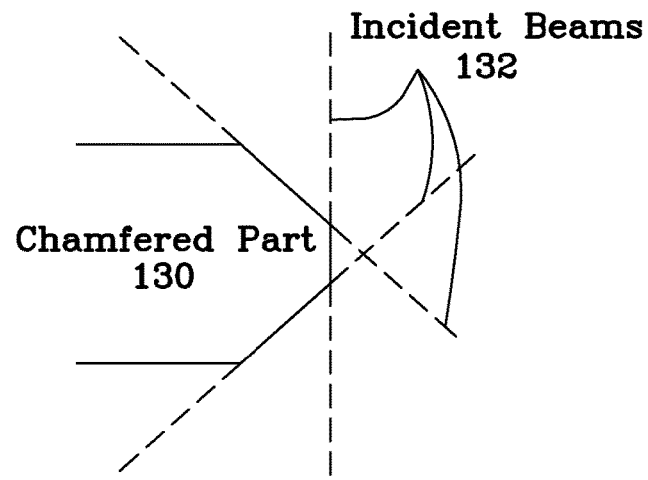

FIG. 26(d) illustrates an example implementation of the formation of a chamfered part 130 via processing with multiple filament forming beams 132 at different angles. It is to be understood that the beam and filament paths can be controlled to form chamfered or bevel edges of various degrees. In the case of concerted (parallel) formation, the beam can be split and directed through optics to achieve multiple beam paths arriving at the target exhibiting angles of incidence other than normal, along with a normally incident beam, such that a three-face edge or chamfer is created.

Figure 26E:
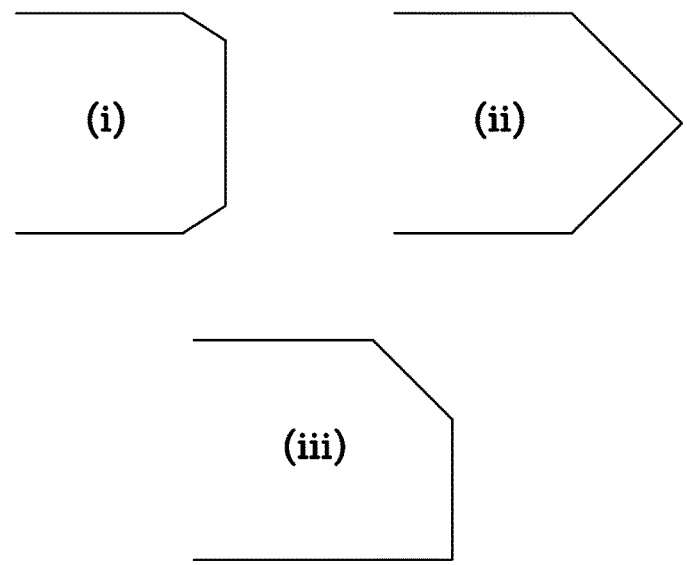

It is to be understood that chamfers can be created with two or more faces, depending, for example, on the degree of splitting tolerated by the process. Some example configurations are illustrated in FIG. 26(e).

In some embodiments, as described below, the laser processing system can be configured such that one laser (with beam splitting optics) can perform both scribing steps simultaneously, provided that the laser has sufficient power. It has been found, for example, that a laser with an average power of approximately 75 W is sufficient to perform all processing steps simultaneously.

The aforementioned apparatus, with multi-axis rotational and translational control, when utilizing filamentation by burst ultrafast laser pulses to accomplish photoacoustic compression machining may be employed for the purpose of bringing the beam on to the work piece(s) at variable focus positions, non-normal angles of incidence and at variable, recipe controlled positions to create curvilinear zones of filament arrays, for the purpose of cutting out closed-form shapes to create products such as glass HDD platters (from magnetic media covered glass substrate) which is presently not possible using the laser ablative machining techniques currently employed. Those skilled in the art will recognize that all of these axes are not required for all applications and that some applications will benefit from having simpler system constructions. Furthermore, it is to understood that the apparatus shown in but one example implementation of the embodiments of the present disclosure, and that such embodiments may be varied, modified or hybridized for a wide variety of substrates, applications and part presentation schemes without departing from the scope of the present disclosure by the device manufacturers.

The Microchip Fabrication Methodology

The electro/mechanical microchip is formed from by joining individual transparent substrate wafers together. The electro/mechanical microchip can be made of Silicon or glass or another transparent substrate. The individual transparent substrate wafers include circuit elements therein and/or thereon and/or therethrough. Mechanical devices may also be arranged in the wafers or on the wafers. The wafers may be as thin as 10 microns (50-500 micron thick borosilicate glass would be a typical working thickness range and substrate.) Each of the wafers may or may not be laser machined to include orifices, troughs, channels, cuts, etc or coated with layers of active or passive material to form electrodes, wirings, electrical and mechanical conduits, electrical and mechanical sensors, transistors, capacitors, diodes, Zener diodes, Schottky diodes, linear and switching power supplies, power supply circuits including bridge circuits, chemical and biological analytic circuits, microfluidic channels, microfluidic controls and other microelectronics. When stacked together these various wafers define operational voids formed within the microchip. Components, glue, conductive media and the like may be inserted before the wafers are layered and joined.

In other situations these may be added after the wafers have been layered and joined. These wafers may be joined by laser welding of the substrates themselves, laser welding of metal powder or thin metal sheets affixed about the microchip's periphery, or by gluing. A completed microchip may be utilized as a "smart dust" sensor for one time use in hazardous environments. It may also just function as a simple PCB in an electronic device.

Figure 27:
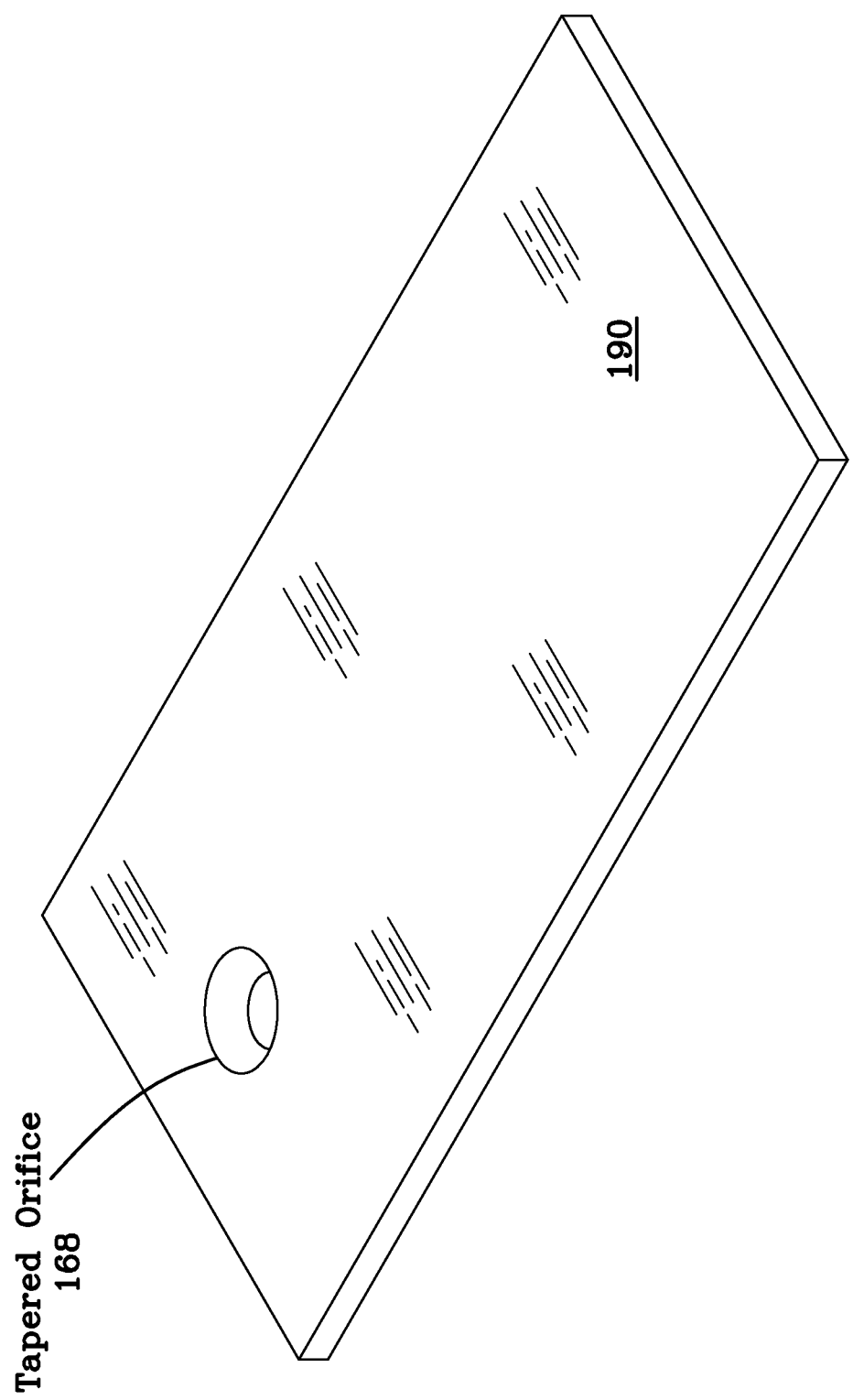
FIG. 27 is a perspective view of a transparent planar substrate wafer that has been machined to form a tapered orifice therethrough.
Figure 28:
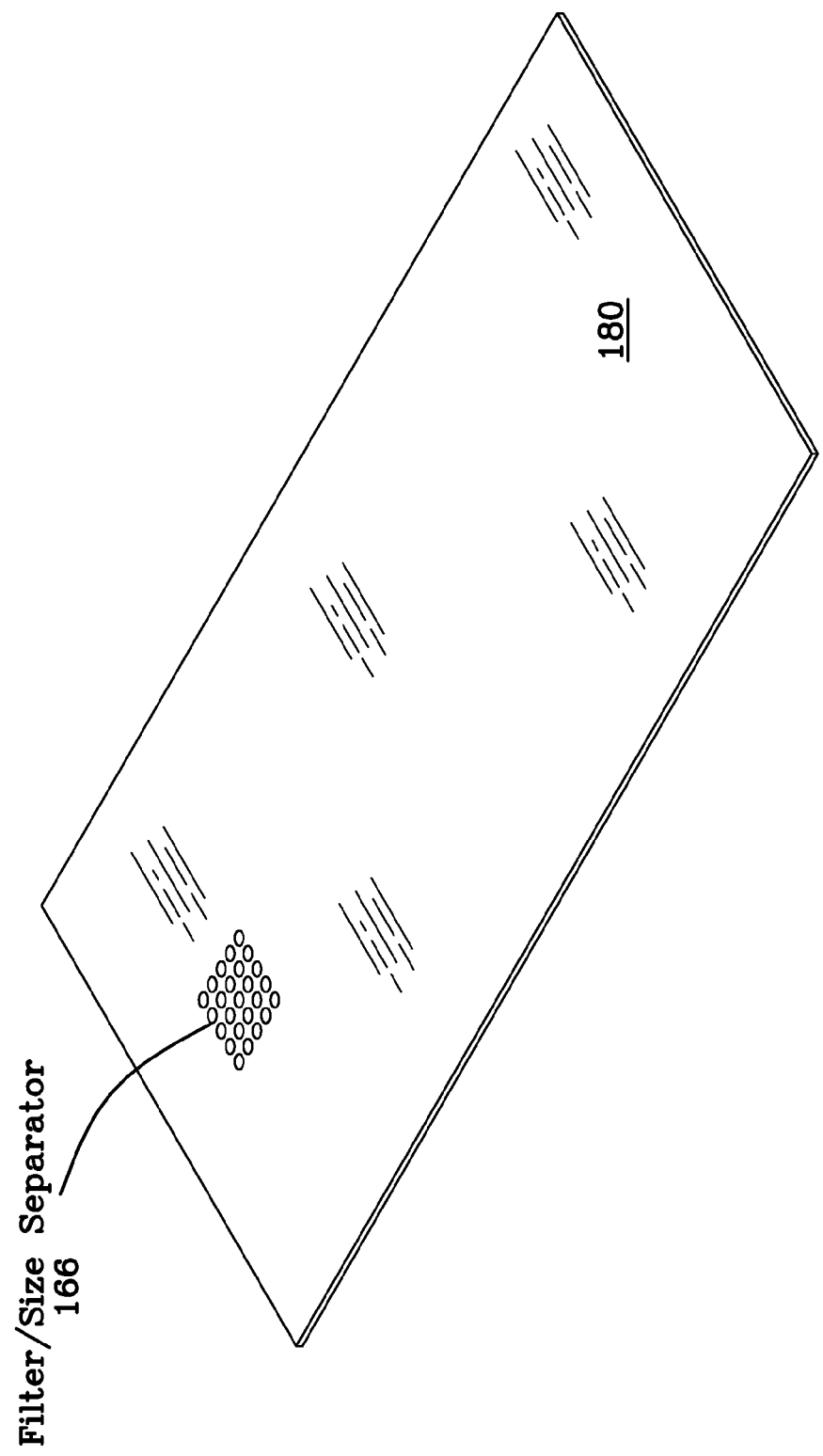
FIG. 28 is a perspective view of a transparent planar substrate wafer that has been machined to form a size separator or filter therethrough.
Figure 29:
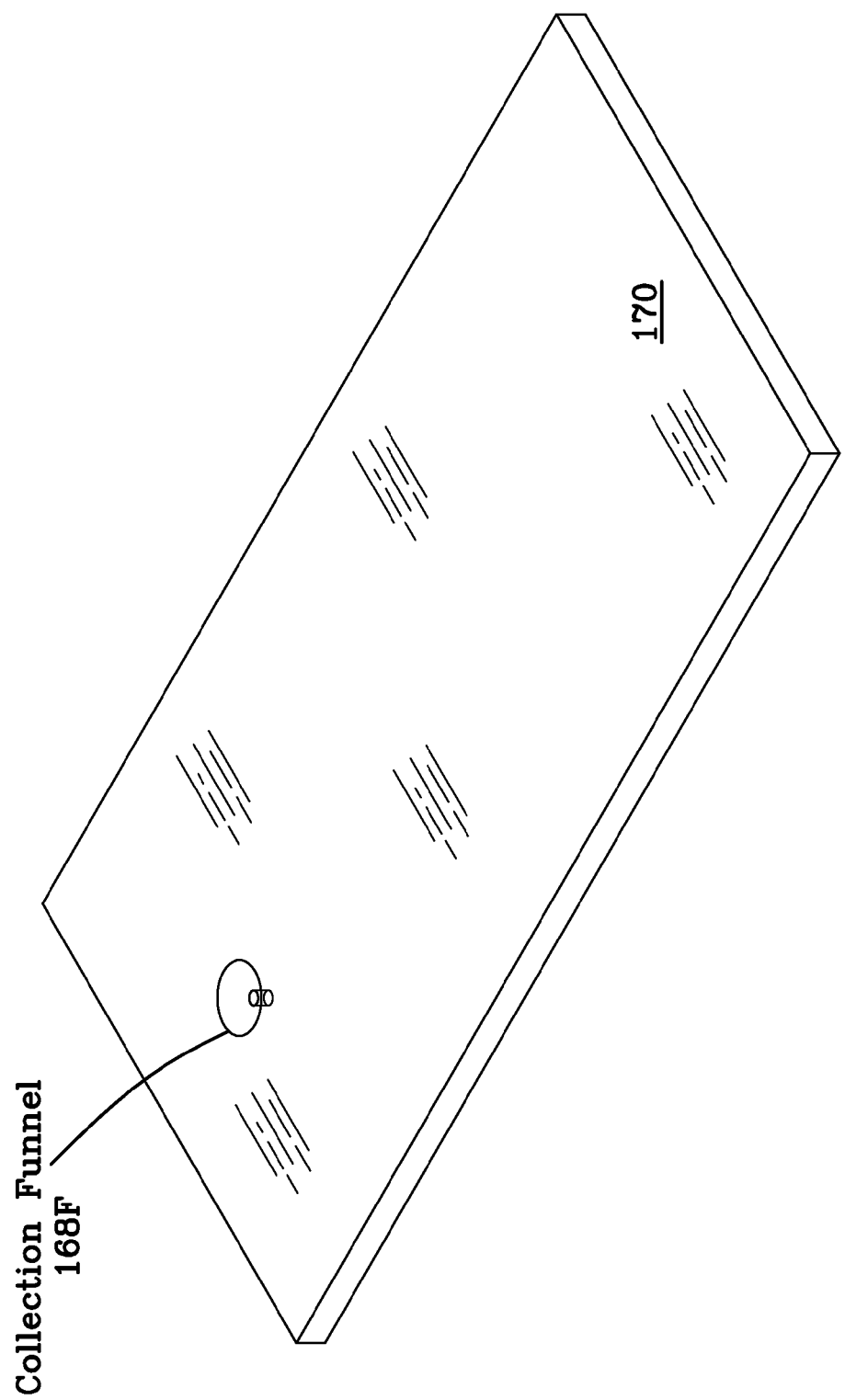
FIG. 29 is a perspective view of a transparent planar substrate wafer that has been machined to form a collection funnel therethrough.

FIG. 27 has a tapered orifice 168 in substrate 190 that can be used to size particles, funnel a gas to a pathway, allow for injection of an electrically conductive media to a void in a wafer below or house a component. FIG. 28 shows a transparent planar substrate 180 wafer that has been machined to form a size separator or filter 166 therethrough. Size separator 166 resides over frustoconical funnel 168F formed in substrate 170 that is aligned beneath filter 166. See FIG. 29. In this way a sample may be collected based on size and then transported to a pathway on a wafer two levels below for some type of sample collection analysis. If such a sampling or analytical device were made of glass and fitted with an inexpensive RFID chip to transfer information wirelessly, it could be tossed into a tank of chemical or radiological material, the analysis made, and reported, then the microchip can be left in the tank.

Figure 30:
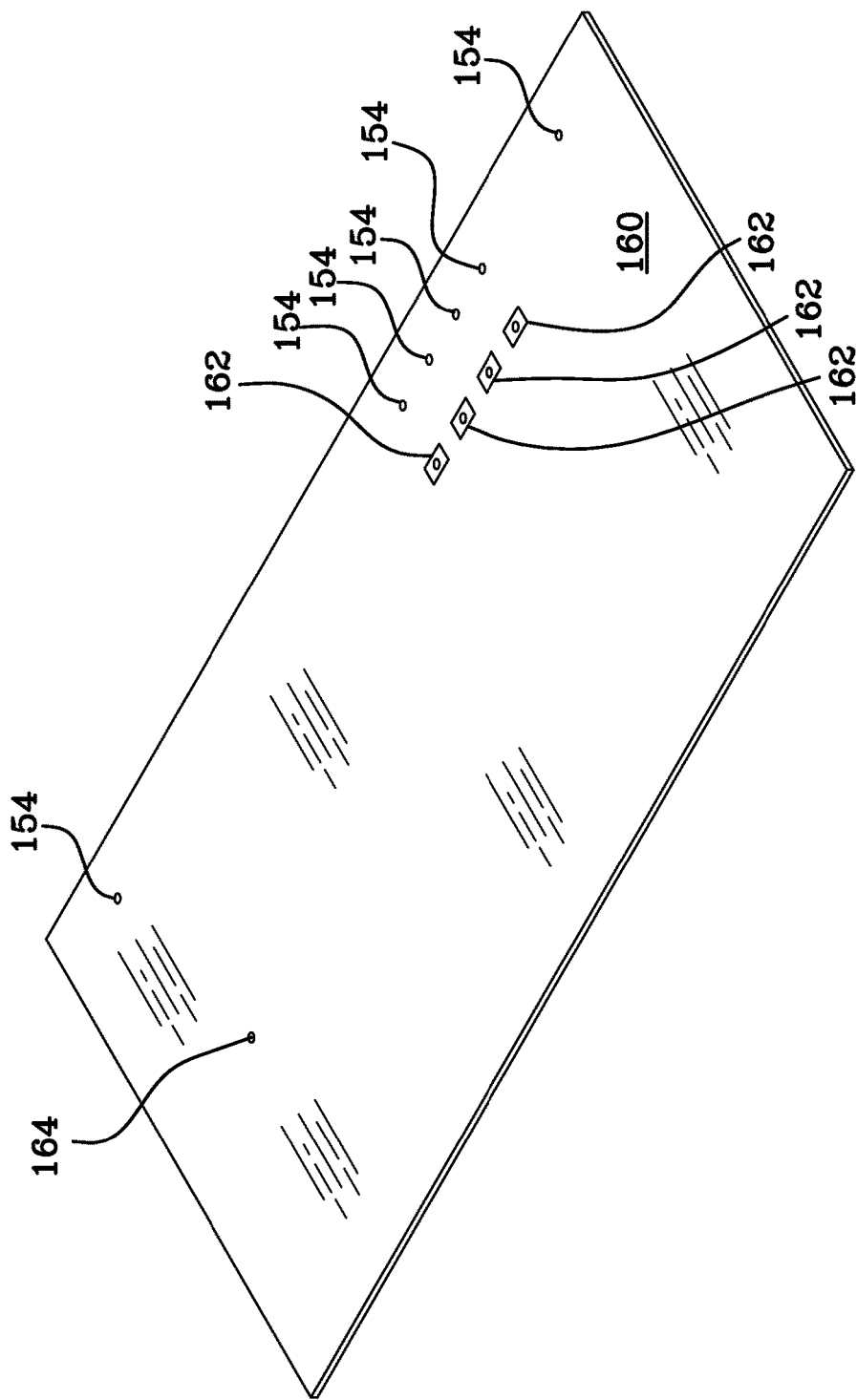
FIG. 30 is a perspective view of a transparent planar substrate wafer that has been machined to form orifices to accept inserts.
Figure 31:
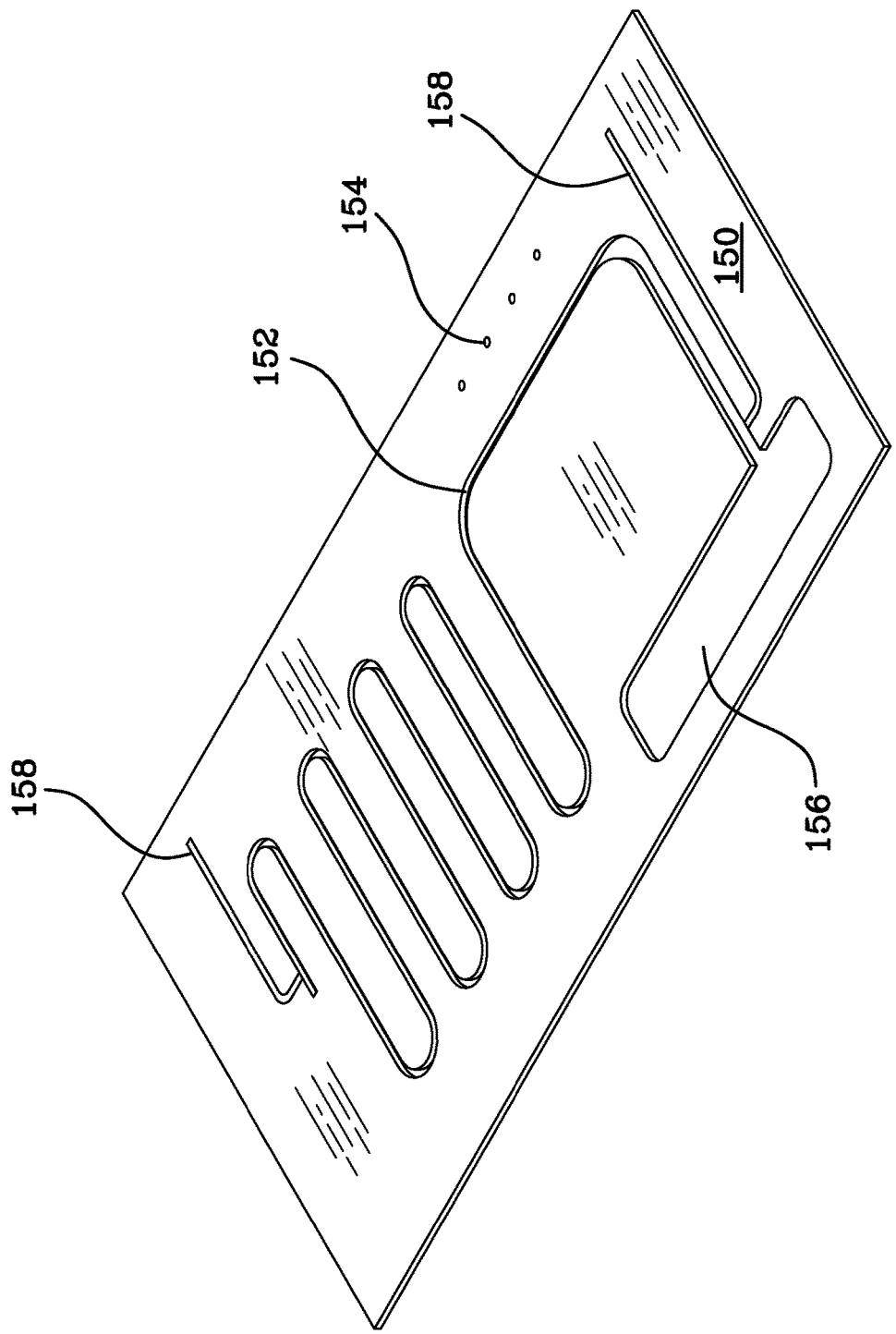
FIG. 31 is a perspective view of a transparent planar substrate wafer that has been machined to form a pathway through the wafer.

If the substrate wafer 160 of FIG. 30 were placed directly atop wafer 150 of FIG. 31 it can be seen that the component mounting inserts 162 (which extend through substrate 160) would reside above the pathway 152 and the orifices 154 on both wafers would align. Electrodes 158, 158 would, of course, be powered through some means not shown. Component mounting inserts 162 engage pathway 152 and are powered therefrom. This allows for a component such as an LED or laser to reside several wafers above the power source.

The wafer 160 of FIG. 30 is placed over wafer 150 of FIG. 31. Orifices 154 align and could serve as a point for the injection of an electrically conductive media therein enabling electrical communication between substrates. Orifice 164 (fed from funnel 168 of FIG. 29) can introduce gas/fluid media into pathway 152 for sampling purposes. An analyzer can reside in void 156.

FIG. 31 is a perspective view of a transparent planar substrate wafer 150 that has been machined to form a pathway, channel 152, through the wafer. This wafer also has a series of four component mounting orifices, or holes 154. If this wafer 150 was sandwiched between two other non machined wafers, a pathway or channel 152 for the passing of a fluid/gas would be formed (microfluidic channel). Alternatively, if the pathway 152 were high pressure injected with an electrically conductive media, an electrical signal could be carried to a component residing in the large void 156. It is to be noted that there are two electrodes 158, 158 formed at either end of the pathway 152. Preferably the electrodes 158, 158 are printed on top of the glass substrate 150 using photolithographic techniques. The height of electrodes 158, 158 sitting on top of the glass substrate 15 is small so there is generally no need to make a grove to hide them. With electrodes sitting on top of the glass substrate 150, the glass substrates can still be joined and welded together.

Figure 32:
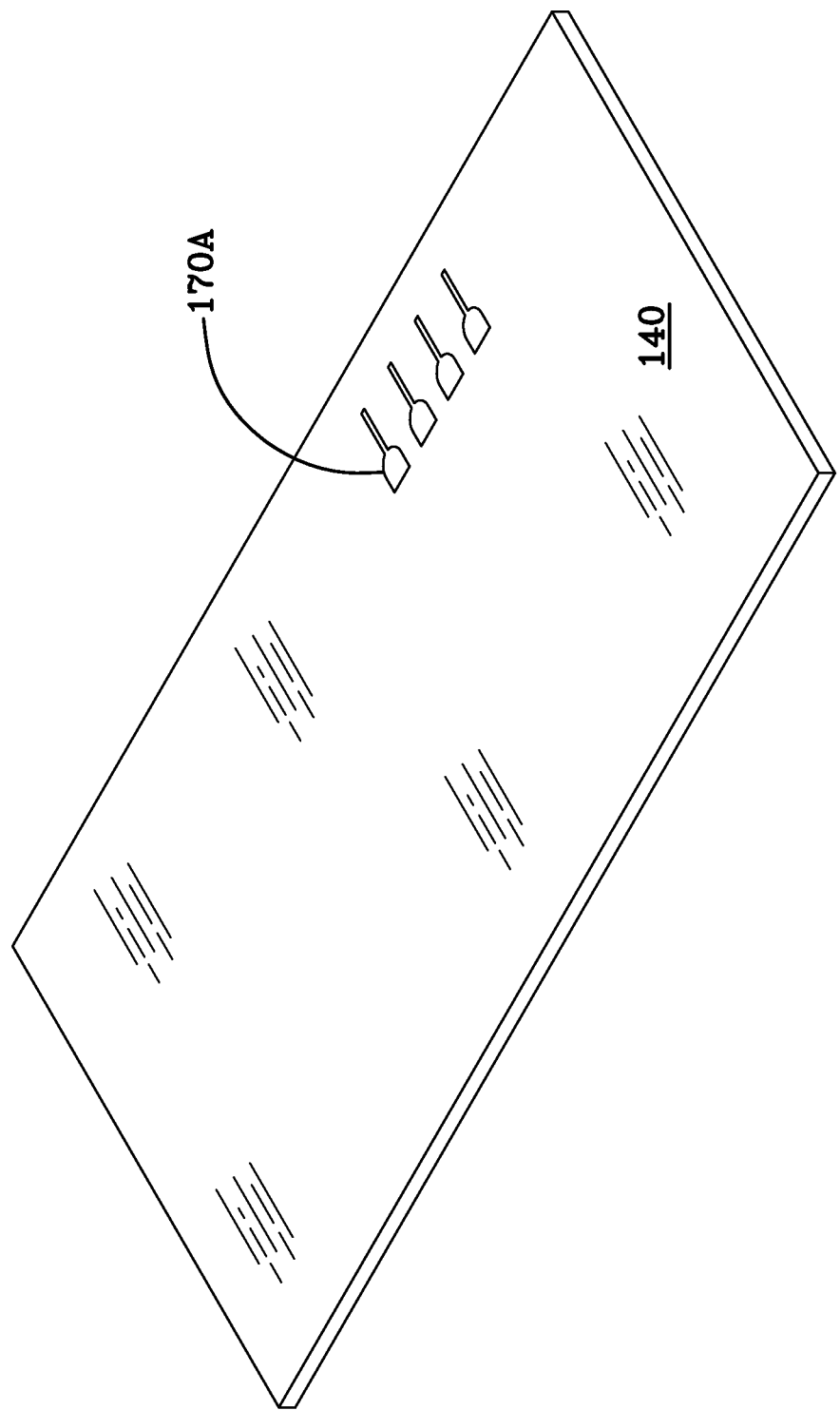
FIG. 32 is a perspective view of a transparent planar substrate wafer that has been machined to form component cutouts.

Alternatively, electrodes can be buried inside the glass substrate having a groove therein. Alternatively, the electrodes may reside in a void machined in the glass substrate 150. The electrodes 158, 158 require only a separate top wafer to define the path of the electrodes since the voids beneath the electrodes do not extend through the wafer 150. FIG. 32 illustrates multiple sensors 170A or similar components in wafer substrate 140. FIG. 32 illustrates base substrate 140 for the chip.

Figure 33:
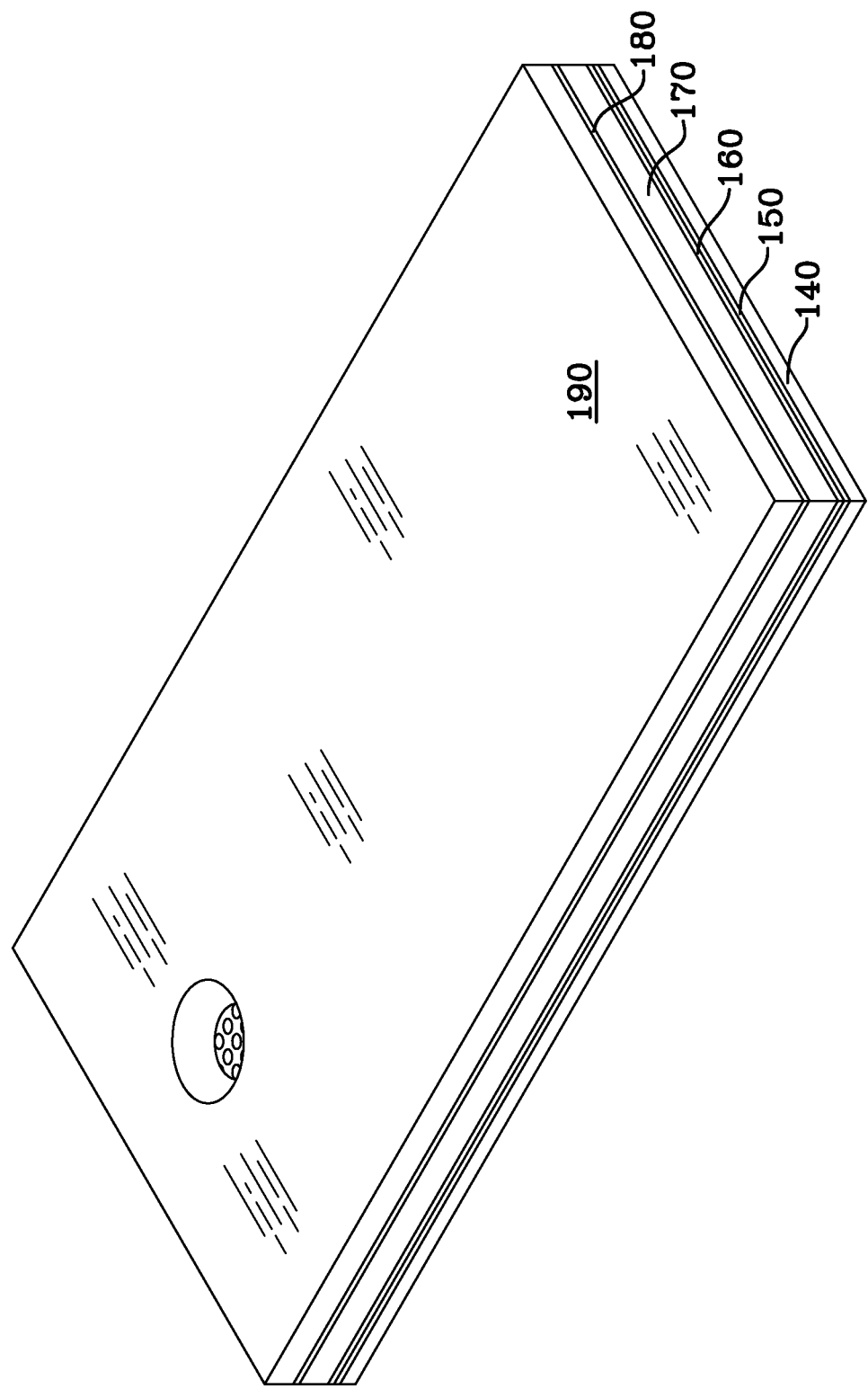
FIG. 33 is a stack of the substrates of FIGS. 27-32.

Therefore, the substrates may be combined and organized to form a combined chip. FIG. 33 is a stack of the substrates of FIGS. 27-32. FIG. 33 illustrates one example chip stacked combination from top to bottom, of substrates 190, 180, 170, 160, 150 and 140 as illustrated in FIGS. 27-31. The top substrate is illustrated by reference numeral 190 and the bottom substrate is illustrated by reference numeral 140. The combined chip is secured together by adhesive and/or by laser welding. The combined chip communicates electrical signals and or substances as described above and as illustrated by the substrates. As illustrated in FIG. 33, the substrates can be of different thicknesses as necessary depending on the function of the chip, mechanical, electrical biological, or any combination thereof.

By appropriately stacking components and binding them using glue or laser welding chips can be manufactured that can be used as biochip or MEMS or microfluidic channel depending on the design and application.

Using ultrafast laser pulses it is possible to fabricate waveguides, volume gratings, combiners, etc. . . . that make the chips even more advanced. Utilizing the above detailed laser machining technology in conjunction with the ability of the computerized laser machining system to precisely focus the filamentation formed relative to the transparent substrate wafer by the burst of ultrafast laser pulses, allows for precise formation of the desired void or cut in each individual layer. The fact that the orifices, cuts, channels, reservoirs, etc. can be cut without taper, and cleanly without debris or collateral damage such as microcracking allows the precise and close placement of adjacent features useful for a wide array of purposes. By altering the filament relative to the wafer allows for unlimited full or partial cuts to be made in the wafer. Because of the computerized 3D modeling capability and the precision of cuts, a plethora of voids can be cut incorporating both acute and obtuse angles, (including reentrant profiles) such as would be necessary for a size separator, vent or funnel.

The method for machining full or partial voids on a transparent substrate proceeds with the following steps:

providing a transparent material;

providing a laser beam comprising a burst of laser pulses;

providing a laser beam delivery system capable of focusing the laser beam onto a target (transparent material or wafer) and to enable relative movement between the laser beam and the target;

focusing the laser beam relative to the transparent material to form a beam waist at a location that is external to the transparent material, wherein the laser pulses incident on the surface of the transparent material are focused such that a sufficient energy density is maintained within the transparent material to form a continuous laser filament there through without causing optical breakdown;

propagating an orifice about said filament that traverses completely through a section of transparent material by photoacoustic compression;

enabling relative movement between the focused laser beam and the transparent material with the laser beam delivery system, so as to move the location of the laser filament causing the orifice in the transparent material to make a cut through said section of transparent material and form a transparent wafer;

focusing the laser beam relative to the wafer to form a beam waist at a location that is external to the wafer, wherein the laser pulses incident on the surface of the wafer are focused such that a sufficient energy density is maintained within the wafer to form a continuous laser filament there through without causing optical breakdown;

propagating an orifice about said filament that traverses completely through the wafer by photoacoustic compression; and, enabling relative movement between the focused laser beam and the wafer with the laser beam delivery system, so as to move the location of the laser filament causing the orifice in the wafer to machine a trough, channel, slice, cut or the like, through said wafer.

From this point on, the steps of the assembly may vary in order. After the machining of each of the wafers, the wafers are stacked or layered in a precise orientation and position so as to functionally enable the synergistic geometric configuration of the various voids. There may be components inserted as the assembly occurs or the components may be inserted afterwards depending on the microchip's design. Similarly, there may be an electrically conductive media or a glue or a chemical or a catalyst placed into a specific void in a specific layer or they may be applied or injected thereafter. The wafers are then joined by laser welding of the wafer's edges themselves or by metal edging. UV curable glues may be dried onto the wafer's surfaces and used at a later date for joining wafers. It is to be noted that wafers may be coated before machining or before assembly with the desired coating on the desired surface. An example of such a coating could be magnetic media.

By adjusting the above described laser filament machining process, very thin wafers of glass or other transparent material can be created and further machined and layered into complex three dimensional microchip devices. These microchips have functionality for handling liquids, gasses, particulate, electrical signals, optical signals or other signal processing activities.

This method of microchip fabrication eliminates many micro fabrication problems such as making channels inside the bulk of glass using laser material modification and etching. There is no need for etching, masking and copper deposition on the wafers. Since the orifices drilled do not taper in size (which is a common dimensional problem with etched orifices) the spacing between components is reduced (since the base or footprint of the orifice does not widen) and the overall size of the microchip is minimized. The thickness of the wafers can be reduced to the 10 micron range. Using glass for biological sampling devices is a much better material for the microchips than is rough and porous plastic. Indeed glass has negative charges and has optical transparency that plastic doesn't have. Additionally, some chemicals intend to interact with plastics.

The instant invention is used to drill holes in microfabrication of printer heads. A printer head is the front face of a printer cartridge that has been drilled to accommodate the flow of printer ink from the cartridge. Commonly these are made from silicon or glass. Currently, there are several methods for drilling or boring out the ink holes in a printer head, the most common methodology, however, utilizes high speed drilling of a transparent substrate material sheet with small diameter drills. The problem with this is that the material used for the print head must be extremely wear resistant able to withstand a plethora of duty cycles when erosion of the leading edge becomes an issue. This necessitates fabrication from a material that is tough and hard to drill. Thus the fabrication involves the replacement a high number of drill bits due to the breakage and the dulling on this tough substrate. Additionally, small diameter drills have a propensity to wander and bend or flex under load, drilling orifices that are not properly spaced or that are not parallel to each other and perpendicular to the printer head's face.

Laser ablation to cut the orifices works to a degree but does not leave cleanly cut orifices, leaves surface ejecta about the opening, and does not drill parallel side walled orifices.

As the size and shape of the orifice in the printer changes the objects printed are less clear. As the roughness of the orifice wall increases so does the pressure required to flow the ink. If the walls of the orifices are not parallel a pressure differential develops across the orifice such that the ink does not flow from this orifice identically to another parallel walled orifice. This means that the ideal printer head orifices will have sharply defined circular openings, orifices perpendicular to the front surface of the printer head, evenly spaced orifices, orifices with minimal ejecta about their openings, orifices with smooth walls, and orifices with parallel (non-tapered) side walls.

Another problem with the existing fabrication methods of printer heads is that they either leave a damaged or rough opening with a plethora of micro cracks radiating therefrom.

The state of the art methods do not achieve the required sharp resolution. t

Figure 34:
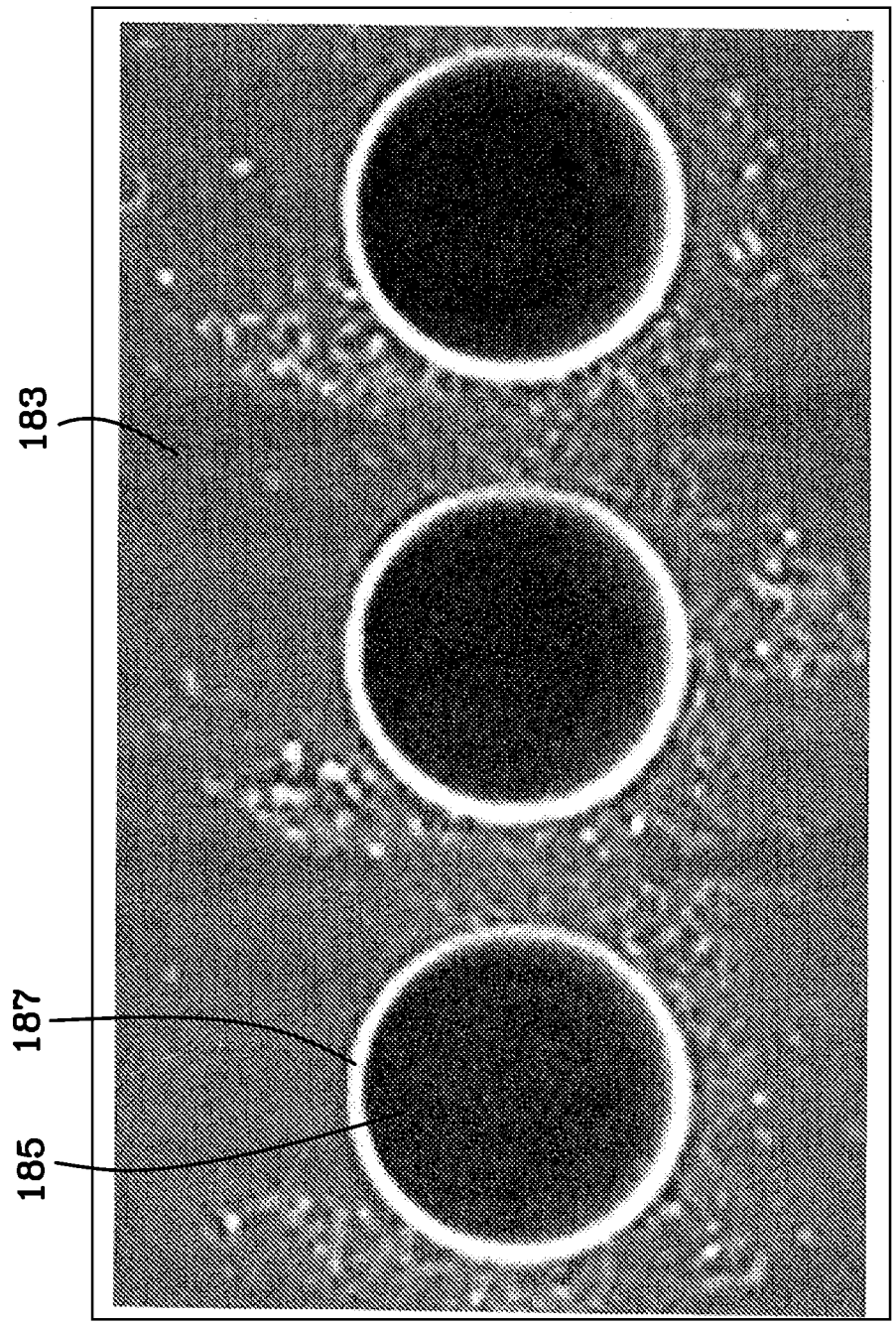
FIG. 34 is a magnified photograph of an array of three printer head orifices in a printer head with a very clean periphery.

FIG. 34 is a magnified photograph of an array of three printer head orifices 185. Referring to FIG. 34, it can be seen that the resultant drilled orifices 185 in the printer head 183 have a very clean periphery 187. This type of precision in orifice drilling results in much higher resolution images made by the printed because of the more tightly regulated ink flow from the printer.

It is to be noted that at all times the laser needs to be focused correctly so as to avoid the formation of a optical breakdown, for of this occurs there will be a sizeable ejecta mound created at the point of the orifice initiation that will necessitate removal by polishing as well as potentially affect collateral damage to the close form and or substrate.

As third example same holes can be used as via holes on thin glass that is used heavily in microelectronics. In CPU manufacturing where the operation frequencies are pushed to their limit, unnecessary lengthening of internal wiring between the devices can cause leakage. More transistors (even they made to their limit in size) need space and the best way of accommodating the above requires is stacking of the substrates. To avoid any electron or hole transfer or any induction via electric fields and still survive heat generated inside the CPU while stacking substrates, glass is the best possible candidate as an insulator. The communication from one level of the stack to the next can be done with vias. The invention can produce approximately 10,000 micro holes per second.

It is to be understood that the invention is not limited in its application to the arrangements of the components set forth in the following description or illustrated in the drawings. The invention is capable of other embodiments and of being practiced and carried out with various different ordered steps. Also, it is to be understood that the phraseology and terminology employed herein are for the purpose of descriptions and should not be regarded as limiting. As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

The invention claimed is:

1. A method for making an electromechanical chip using a first transparent substrate and a second transparent substrate, comprising the steps of:
   machining full or partial voids on said first transparent substrate using photoacoustic compression; and,
   affixing said first transparent substrate and said second transparent substrate together.

2. A method for making an electromechanical chip using a first transparent substrate and a second transparent substrate, comprising the steps of:
   machining full or partial voids in said first transparent substrate using photoacoustic compression;
   machining full or partial voids in said second transparent substrate using photoacoustic compression;
   placing said first and second transparent substrates in engagement with one another such that said full or partial voids of said first transparent substrate communicate with said full or partial voids of said second transparent substrate.

3. A method for making an electromechanical chip using a plurality of transparent substrates, comprising the steps of:
   machining, using photoacoustic compression, full or partial voids in at least one of said plurality of substrates;
   stacking said plurality of transparent substrates in a specific order;
   affixing said substrates together.

4. A method for making an electromechanical chip using a plurality of transparent substrates as claimed in claim 3, comprising the steps of:
   sealing said chip by laser welding said transparent substrates together.

5. A method for making an electromechanical chip using a plurality of transparent substrates as claimed in claim 3, wherein said plurality of transparent substrates include varying thicknesses.

6. A method for making an electromechanical chip using a plurality of transparent substrates as claimed in claim 3, wherein said step of stacking said plurality of transparent substrates includes aligning said full or partial voids in at least two said transparent substrates.

7. A method for making an electromechanical chip using a plurality of transparent substrates as claimed in claim 3, further comprising the steps of:
   injecting a gas, liquid or solid into one of said full or partial voids in said at least one of said plurality of substrates, and then sealing said plurality of substrates together.

8. A method for making an electromechanical chip using a plurality of transparent substrates as claimed in claim 7, wherein said step of sealing is performed with a laser.

9. A method for making an electromechanical chip using a plurality of transparent substrates as claimed in claim 7, wherein said step of sealing is performed with an adhesive.

10. A method for making an electromechanical chip using a plurality of transparent substrates, comprising the steps of:
    machining, using photoacoustic compression, full or partial voids in at least two of said plurality of substrates;
    stacking said plurality of machined transparent substrates in a specific order and formatting said electromechanical chip as a device selected from the group of electrodes, wires, electrical and mechanical conduits, electrical and mechanical sensors, transistors, TTL circuits, logic circuits, capacitors, diodes, Zener diodes, Schottky diodes, linear and switching power supplies, power supply circuits including bridge circuits, chemical and biological analytic circuits, microfluidic channels, microfluidic controls and other microelectronics; and,
    affixing said substrates together.

11. A method for making an electromechanical chip using a plurality of transparent substrates as claimed in claim 10, further comprising:
    said step of affixing said substrates together is performed with a laser.

\* \* \* \* \*